(12) United States Patent
Nakata

(10) Patent No.: US 9,105,545 B2
(45) Date of Patent: Aug. 11, 2015

(54) IMAGING DEVICE TO CAPTURE IMAGES OF SUBJECTS IN PLURALITY OF DIRECTIONS

(75) Inventor: Masashi Nakata, Kanagawa (JP)

(73) Assignee: Sony Corporation, Tokyo (JP)

( * ) Notice: Subject to any disclaimer, the term of this patent is extended or adjusted under 35 U.S.C. 154(b) by 167 days.

(21) Appl. No.: 13/613,189

(22) Filed: Sep. 13, 2012

(65) Prior Publication Data

US 2013/0083214 A1    Apr. 4, 2013

(30) Foreign Application Priority Data

Sep. 30, 2011    (JP) ................. 2011-216200

(51) Int. Cl.
*H04N 3/14*    (2006.01)
*H04N 5/335*   (2011.01)
*H01L 27/146*  (2006.01)
*H04N 5/225*   (2006.01)
*H01L 31/062*  (2012.01)
*H01L 31/113*  (2006.01)

(52) U.S. Cl.
CPC ...... *H01L 27/1464* (2013.01); *H01L 27/14618* (2013.01); *H01L 27/14621* (2013.01); *H01L 27/14623* (2013.01); *H01L 27/14627* (2013.01); *H01L 27/14629* (2013.01); *H01L 27/14632* (2013.01); *H01L 27/14634* (2013.01); *H01L 27/14636* (2013.01); *H01L 27/14643* (2013.01); *H04N 5/2257* (2013.01); *H04N 5/2258* (2013.01)

(58) Field of Classification Search
CPC . H04N 5/2254; H04N 5/2253; H04N 5/2252; H04N 5/2259
USPC ......... 348/340, 342–344, 272–274, 302–304; 257/291–292, 347
See application file for complete search history.

(56) References Cited

U.S. PATENT DOCUMENTS

| | | | |
|---|---|---|---|
| 2011/0074960 A1* | 3/2011 | Nagata .......................... | 348/164 |
| 2011/0080474 A1* | 4/2011 | Igarashi ......................... | 348/65 |
| 2011/0234869 A1* | 9/2011 | Hiramoto et al. ............ | 348/294 |
| 2011/0242350 A1* | 10/2011 | Sawayama ................ | 348/222.1 |

FOREIGN PATENT DOCUMENTS

| | | |
|---|---|---|
| JP | 4000449 | 8/2007 |
| JP | 2007-306387 | 11/2007 |

* cited by examiner

*Primary Examiner* — Kelly L Jerabek
(74) *Attorney, Agent, or Firm* — Sony Corporation

(57) ABSTRACT

An imaging device includes a silicon substrate having a photoelectric conversion element therein, and a wiring layer on a front-surface side of the silicon substrate. The photoelectric conversion element performs photoelectric conversion on light which enters the photoelectric conversion element from the front-surface side through the wiring layer, and performs photoelectric conversion on light which enters the photoelectric conversion element from a back-surface side of the silicon substrate without going through the wiring layer.

18 Claims, 31 Drawing Sheets

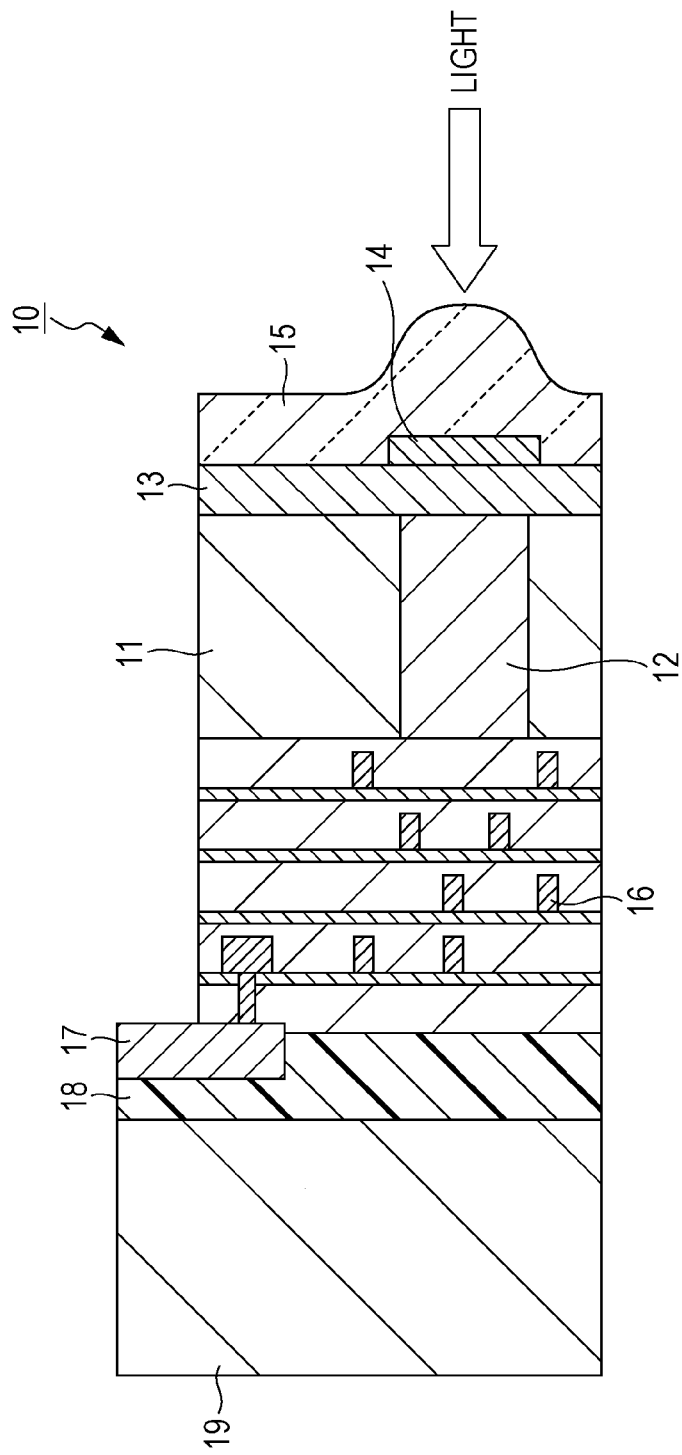

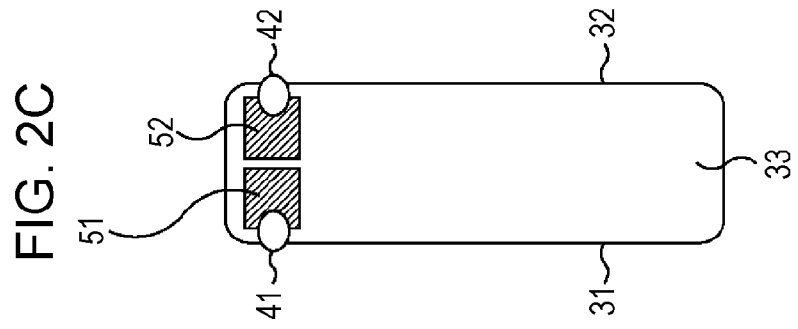
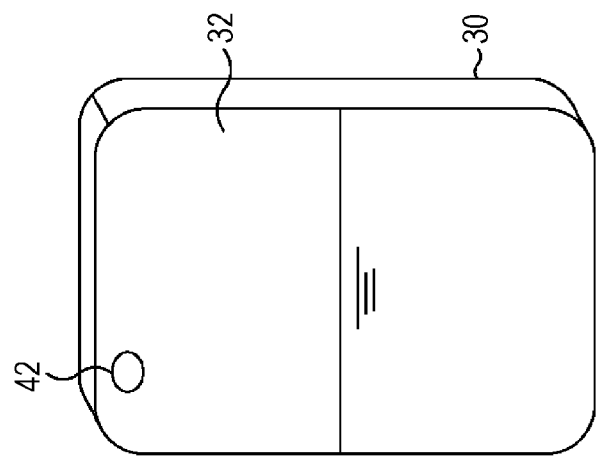
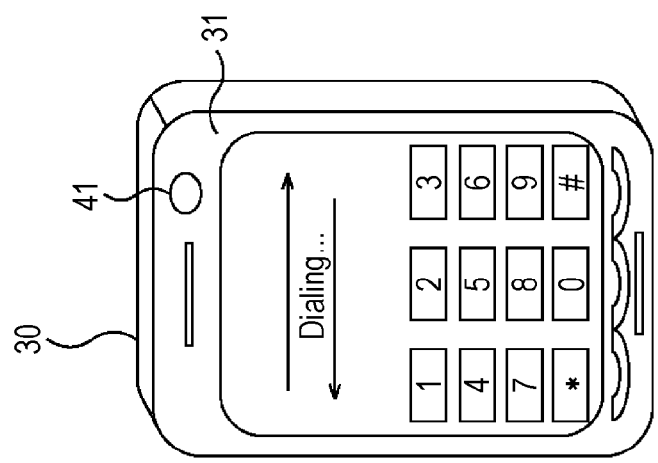

PERIPHERAL-CIRCUIT REGION | PIXEL REGION
PRESSURE    PRESSURE

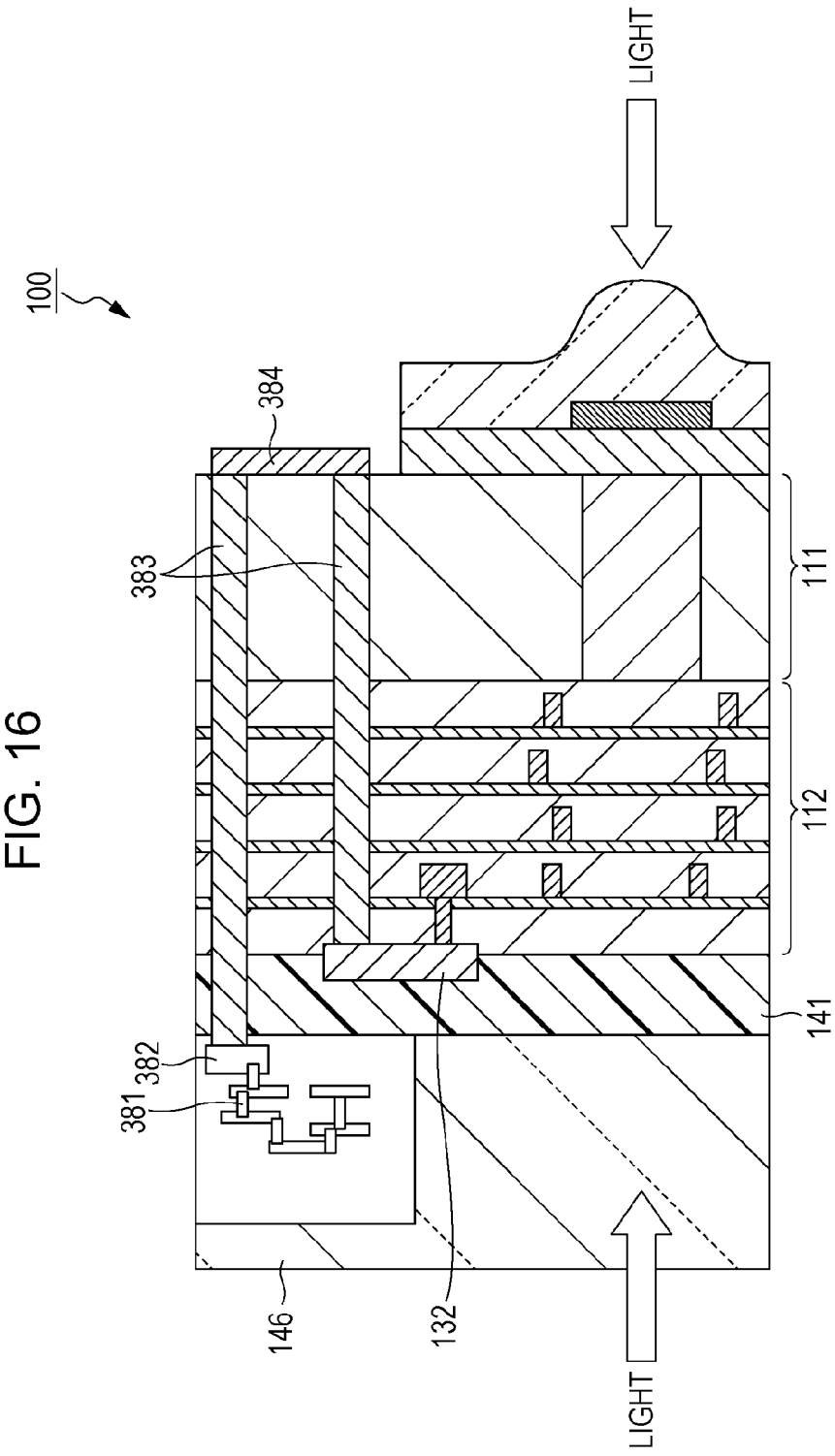

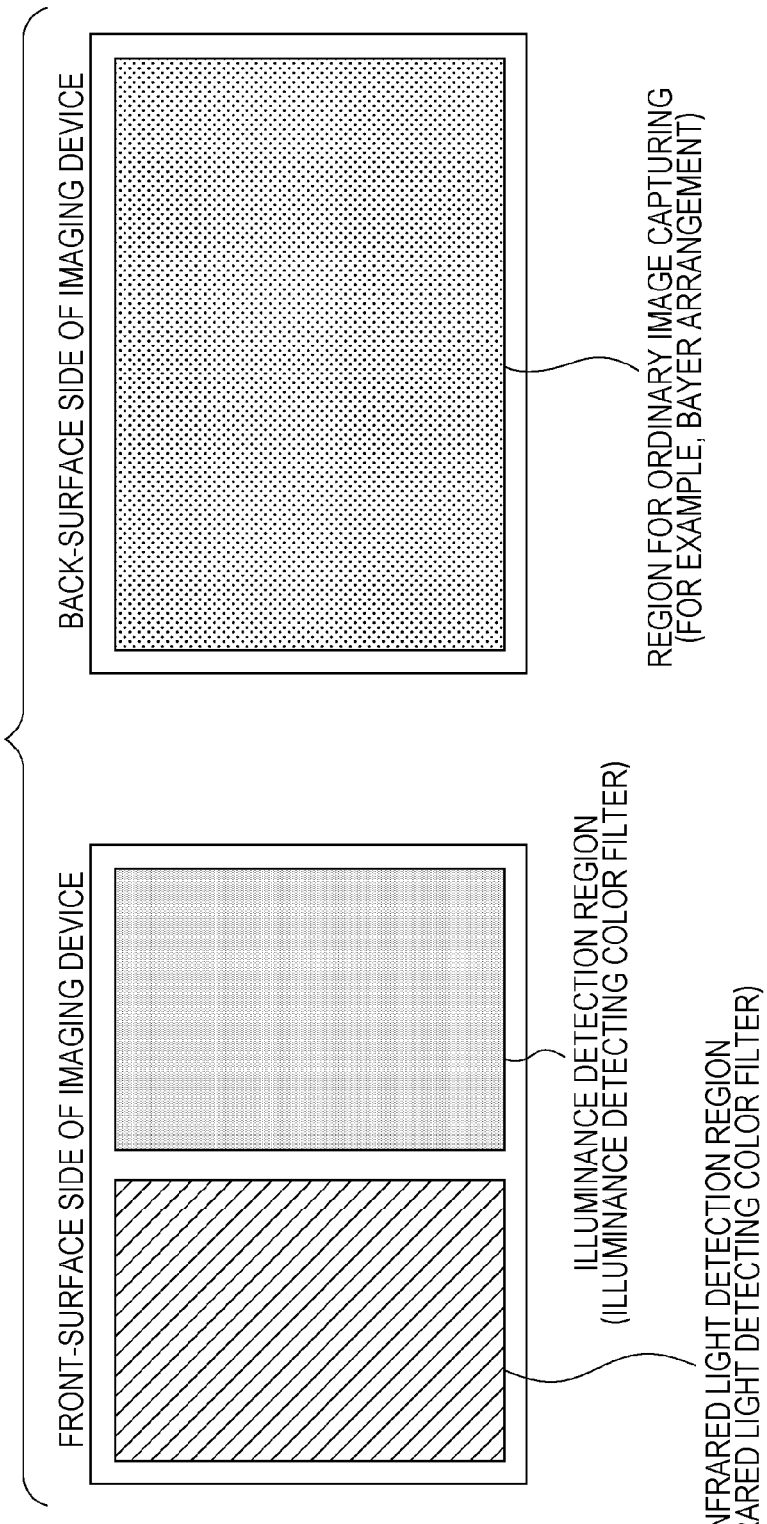

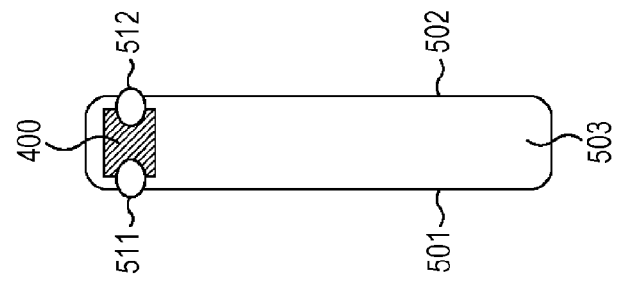
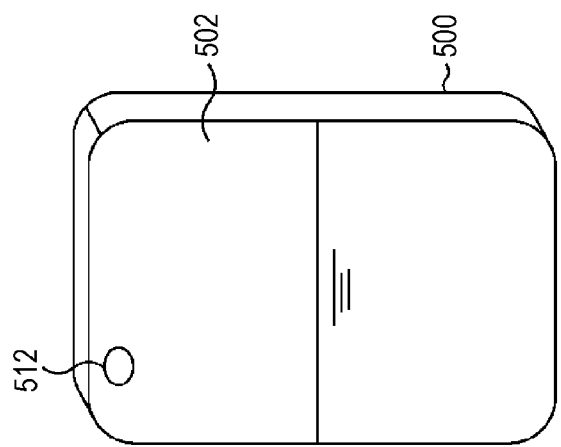
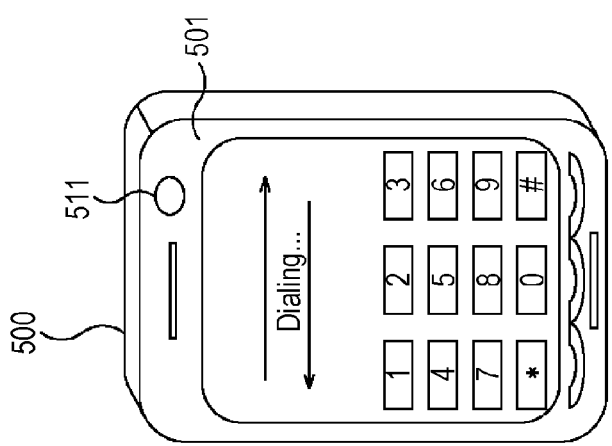

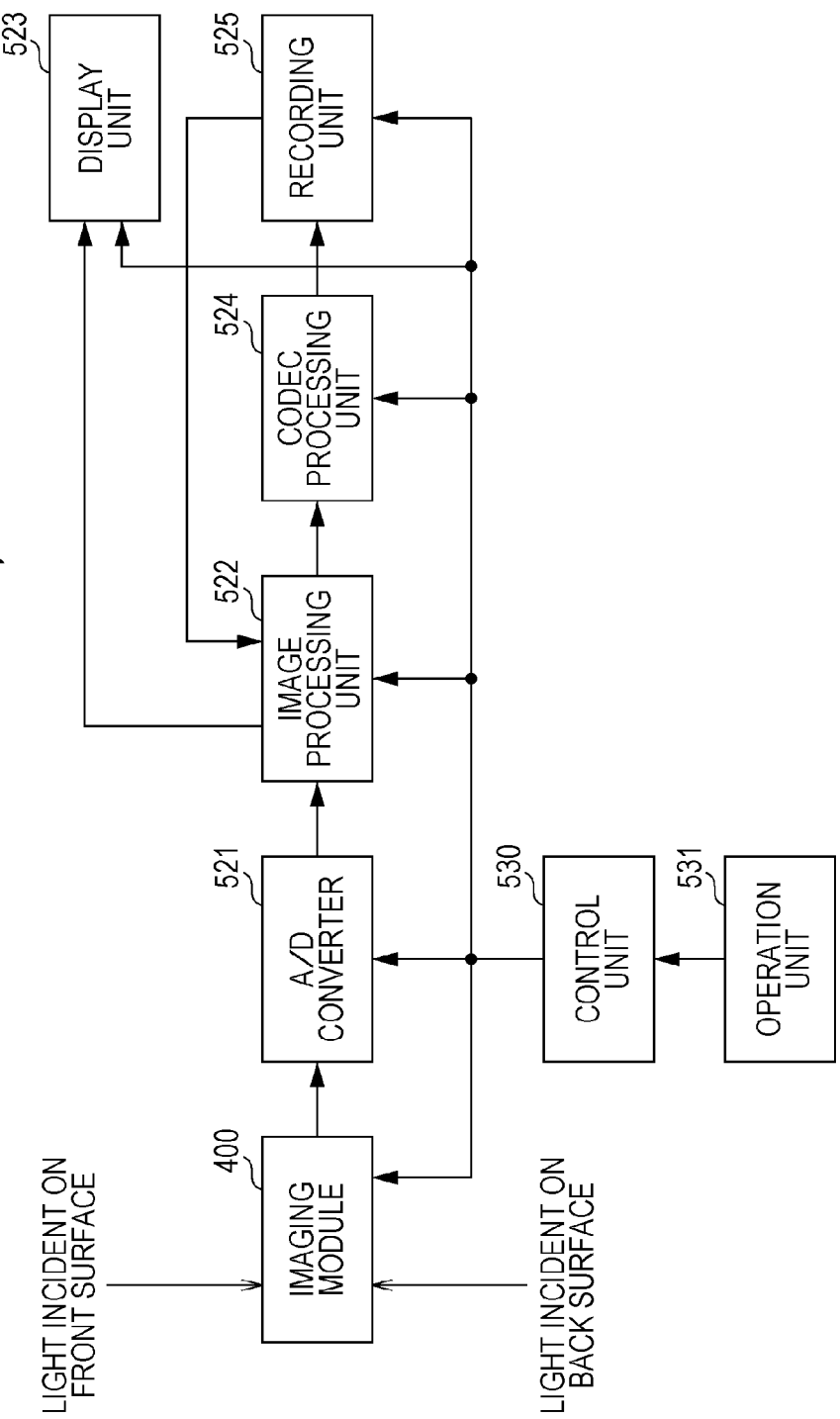

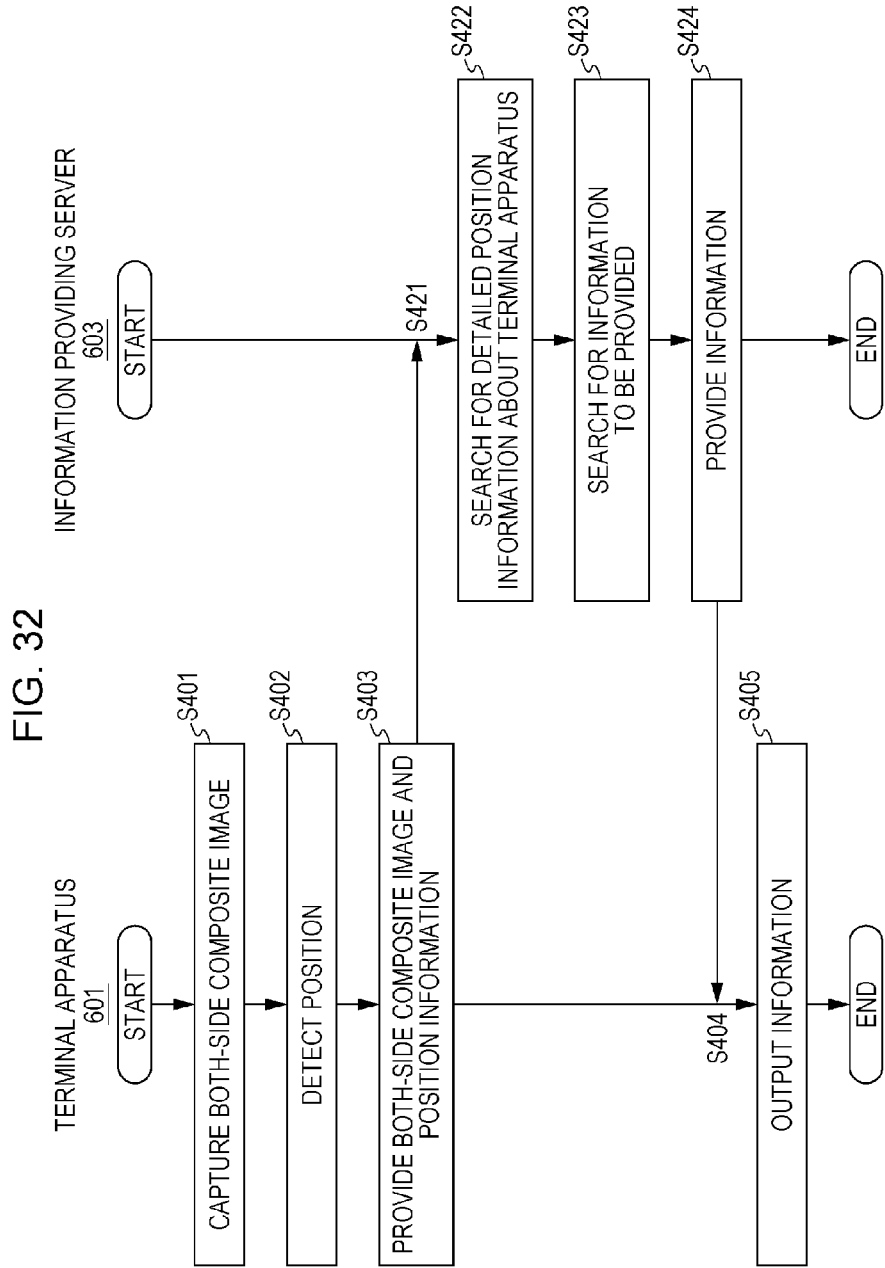

IMAGING DEVICE TO CAPTURE IMAGES OF SUBJECTS IN PLURALITY OF DIRECTIONS

BACKGROUND

The present disclosure relates to imaging devices, electronic apparatuses, and manufacturing methods, and more specifically to an imaging device capable of capturing images of subjects in a plurality of directions, an electronic apparatus including the imaging device, and a manufacturing method for manufacturing the imaging device.

Electronic apparatuses, in particular, information communication terminals such as mobile phones, may be provided with two or more image sensors. Examples of such image sensors include an image sensor of a main camera for taking photographs, an image sensor of a sub-camera used for video phone calls, an illuminance sensor for sensing ambient illuminance, and an infrared sensor for sensing infrared light.

Reductions in size, thickness, and cost have been continuously demanded for such electronic apparatuses. Also, it is demanded that the electronic apparatuses have multiple image sensors, but this may hinder reductions in size, thickness, and cost.

There has been suggested a method of pasting two imaging devices together to allow light to be received through the surfaces of the two imaging devices (see, for example, Japanese Unexamined Patent Application Publication No. 2007-306387). In this method, however, two imaging devices are used, and thus the cost of the two imaging devices is incurred. This hinders reduction in cost.

Also, there has been suggested a structure for receiving light through front and back surfaces of an imaging device (see, for example, Japanese Patent No. 4000449).

SUMMARY

However, Japanese Patent No. 4000449 merely describes that the same solid-state imaging device (photoelectric conversion element) is used to perform image capturing on the front-surface side and the back-surface side.

Under these circumstances, further enhancement of performance is demanded.

Accordingly, it is desirable to disclose a more detailed configuration to realize a wider range of applications, higher performance, and lower cost of the function of capturing images of subjects in a plurality of directions, and a smaller size of an electronic apparatus having the function.

According to a first embodiment of the present disclosure, there is provided an imaging device including a silicon substrate having a photoelectric conversion element therein, and a wiring layer on a front-surface side of the silicon substrate. The photoelectric conversion element performs photoelectric conversion on light which enters the photoelectric conversion element from the front-surface side through the wiring layer, and performs photoelectric conversion on light which enters the photoelectric conversion element from a back-surface side of the silicon substrate without going through the wiring layer.

The wiring layer may include a wiring element, which may be disposed in a region in the wiring layer other than a region serving as a light path for light which enters the photoelectric conversion element.

The light path may be provided with a waveguide.

The imaging device may further include a color filter on the back-surface side of the photoelectric conversion element, and a filter on the front-surface side of the photoelectric conversion element, the filter not being a color filter.

The filter may include at least any one of an infrared transmitting filter and a white-pixel filter.

The color filter may be provided for each of pixels, and the color filters for the pixels may be separated from one another by a certain inorganic film.

The imaging device may further include a first on-chip lens on the back-surface side of the photoelectric conversion element, and a second on-chip lens on the front-surface side of the photoelectric conversion element.

The first on-chip lens and the second on-chip lens may be made of an inorganic material.

The imaging device may further include an on-chip lens on the back-surface side of the photoelectric conversion element.

The silicon substrate may have a vertical spectroscopic structure including a plurality of photoelectric conversion elements, each of which is the photoelectric conversion element, as a configuration of each pixel.

The imaging device may further include an electrode portion which serves as an external terminal for a wiring element in the wiring layer. The silicon substrate and the wiring layer may have an opening which allows the electrode portion to be exposed on the back-surface side.

The electrode portion may have a certain thickness so that a component stacked on the electrode portion is higher than a component formed in a pixel region in which the photoelectric conversion element is formed.

The imaging device may further include a support substrate through which light passes and which is bonded to the front-surface side of the wiring layer by using a certain adhesive material.

The imaging device may further include a support substrate through which light passes and which is bonded to the front-surface side of the wiring layer by using plasma bonding.

The imaging device may further include a support substrate through which light passes and which is on the front-surface side of the wiring layer, and a circuit in the support substrate, the circuit being disposed in a region other than a pixel region in which the photoelectric conversion element is formed.

The imaging device may further include a pixel in which light incident on one of the back-surface side and the front-surface side of the photoelectric conversion element is blocked by either or both of a wiring element and a light-shielding film, and in which the photoelectric conversion element performs photoelectric conversion on light incident on the other of the back-surface side and the front-surface side.

The imaging device may further include a first shutter which is on the back-surface side of the photoelectric conversion element and which controls entering of light from the back-surface side, and a second shutter which is on the front-surface side of the photoelectric conversion element and which controls entering of light from the front-surface side. The first shutter and the second shutter may be driven independently from each other.

A pixel region on one side of the photoelectric conversion element may be divided into regions by a light-shielding plate, and pixels in the regions may be used for detecting different wavelength ranges.

According to a second embodiment of the present disclosure, there is provided an electronic apparatus including an imaging device and an image processing unit. The imaging device includes a silicon substrate having a photoelectric conversion element therein, and a wiring layer on a front-surface side of the silicon substrate. The photoelectric conversion element performs photoelectric conversion on light which enters the photoelectric conversion element from the front-surface side through the wiring layer, and performs photoelectric conversion on light which enters the photoelectric conversion element from a back-surface side of the silicon substrate without going through the wiring layer. The image processing unit performs image processing on an image obtained by the imaging device.

According to a third embodiment of the present disclosure, there is provided a manufacturing method for a manufacturing apparatus. The manufacturing method includes manufacturing, with a manufacturing unit, a front-illuminated image sensor; bonding, with a bonding unit, a support substrate through which light passes to a front-surface side of the front-illuminated image sensor by using an adhesive material; polishing, with a polishing unit, a back-surface side of the front-illuminated image sensor; and forming, with a forming unit, an on-chip lens on the polished back-surface side of the front-illuminated image sensor.

According to the first embodiment of the present disclosure, a silicon substrate having a photoelectric conversion element therein, and a wiring layer on a front-surface side of the silicon substrate are provided. The photoelectric conversion element performs photoelectric conversion on light which enters the photoelectric conversion element from the front-surface side through the wiring layer, and performs photoelectric conversion on light which enters the photoelectric conversion element from a back-surface side of the silicon substrate without going through the wiring layer.

According to the second embodiment of the present disclosure, a silicon substrate having a photoelectric conversion element therein, and a wiring layer on a front-surface side of the silicon substrate are provided. The photoelectric conversion element performs photoelectric conversion on light which enters the photoelectric conversion element from the front-surface side through the wiring layer, and performs photoelectric conversion on light which enters the photoelectric conversion element from a back-surface side of the silicon substrate without going through the wiring layer. Image processing is performed on an image obtained thereby.

According to the third embodiment of the present disclosure, a front-illuminated image sensor is manufactured, a support substrate through which light passes is bonded to a front-surface side of the front-illuminated image sensor by using an adhesive material, a back-surface side of the front-illuminated image sensor is polished, and an on-chip lens is formed on the polished back-surface side of the front-illuminated image sensor.

According to the embodiments of the present disclosure, an image of a subject may be captured. Particularly, the performance of the function of capturing images of subjects in a plurality of directions may be enhanced.

BRIEF DESCRIPTION OF THE DRAWINGS

FIG. 1 is a diagram illustrating an example configuration of a back-illuminated imaging device;

FIGS. 2A, 2B, and 2C are diagrams illustrating an example configuration of an electronic apparatus including the back-illuminated imaging device;

FIG. 16 is a diagram illustrating still another example configuration of the front-and-back-illuminated imaging device;

FIG. 23 is a diagram illustrating an example configuration of filters;

FIGS. 24A, 24B, and 24C are diagrams illustrating an example configuration of an electronic apparatus including the front-and-back-illuminated imaging device;

FIG. 25 is a block diagram illustrating an example of an internal configuration of the electronic apparatus including the front-and-back-illuminated imaging device;

FIG. 32 is a flowchart illustrating an example of a flow of an information providing process.

DETAILED DESCRIPTION OF EMBODIMENTS

Figure 3:
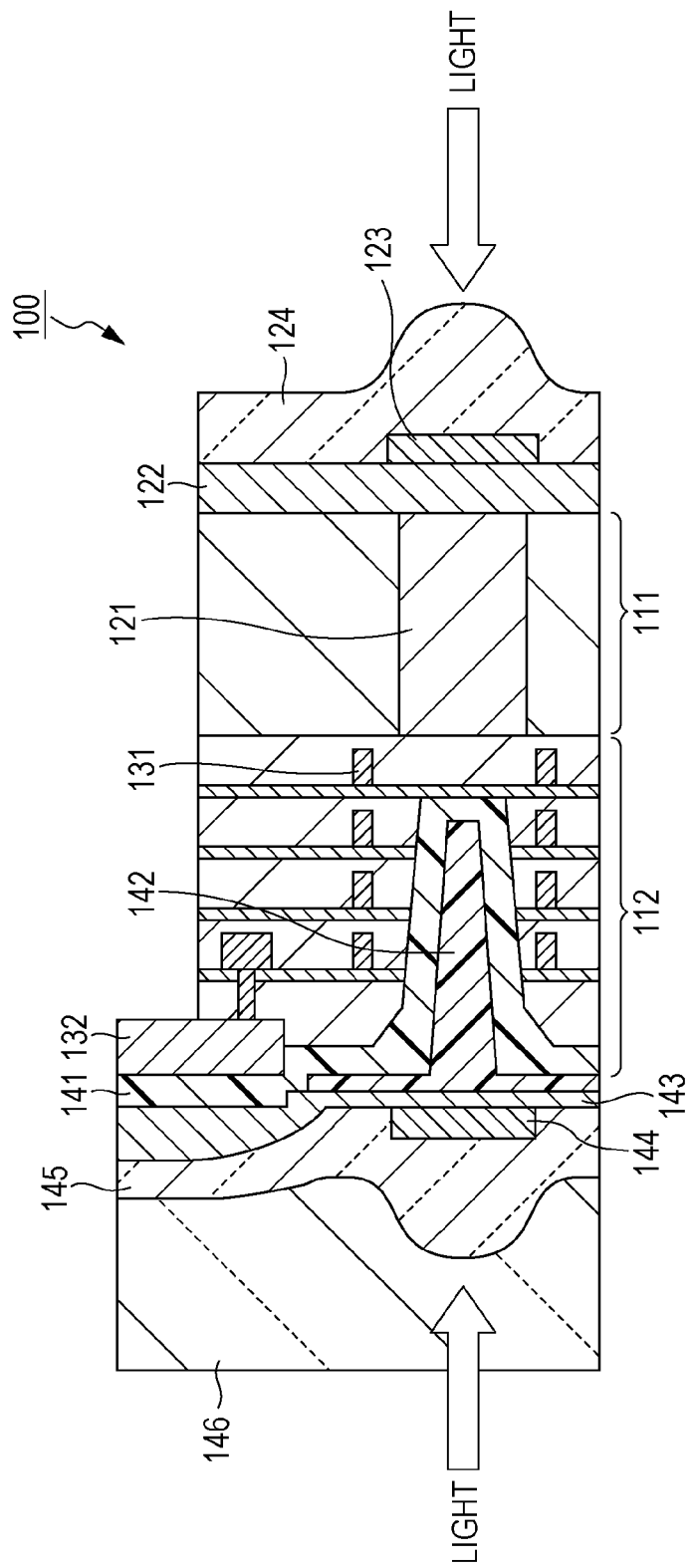
FIG. 3 is a diagram illustrating an example configuration of a front-and-back-illuminated imaging device.

Hereinafter, embodiments for carrying out the present technology will be described. The description will be given in the following order.

1. First embodiment (imaging device, manufacturing apparatus)
2. Second embodiment (imaging module)

3. Third embodiment (electronic apparatus)
4. Fourth embodiment (information providing system)

1. First Embodiment

Back-Illuminated Imaging Device

FIG. 1 is a diagram illustrating an example configuration of a back-illuminated imaging device 10 (hereinafter simply referred to as "imaging device 10"). The imaging device 10 illustrated in FIG. 1 is a back-illuminated complementary metal oxide semiconductor (CMOS) image sensor that includes a wiring layer on a front-surface side of a semiconductor substrate, in which photoelectric conversion elements such as photodiodes are formed, and that performs photoelectric conversion on light incident on a back-surface side by using the photoelectric conversion elements.

A photodiode 12, which performs photoelectric conversion on incident light, is formed in a silicon substrate 11 of the imaging device 10. In FIG. 1, the left side is a front-surface side, and the right side is a back-surface side. A planarizing film 13, a color filter 14, and an on-chip lens 15 are formed on the back-surface side of the silicon substrate 11. The photodiode 12 performs photoelectric conversion on light incident on the back-surface side, entering through the on-chip lens 15, the color filter 14, and the planarizing film 13.

A wiring layer including wiring elements 16 for a circuit, which reads charges stored in the photodiode 12, is formed on the front-surface side of the silicon substrate 11. A pad electrode portion 17, which serves as an external terminal of the circuit, is formed on the front-surface side of the wiring layer. Also, a passivation film 18 or the like is formed on the front-surface side of the wiring layer, for the purpose of protection. Furthermore, a support substrate 19 is formed on the front-surface side of the passivation film 18.

With this configuration, the imaging device 10 performs photoelectric conversion on only light incident on one side (back-surface side).

Electronic Apparatus

FIGS. 2A, 2B, and 2C are diagrams illustrating an example configuration of an electronic apparatus 30 including the above-described imaging device 10.

The electronic apparatus 30 illustrated in FIGS. 2A, 2B, and 2C includes the imaging device 10 illustrated in FIG. 1, and is capable of capturing images of subjects on both of front and back sides of the apparatus. As illustrated in FIG. 2A, the electronic apparatus 30 includes a front lens 41, which is on a front surface 31 of the casing. As illustrated in FIG. 2B, the electronic apparatus 30 includes a back lens 42, which is on a back surface 32 of the casing.

FIG. 2C is a perspective view of the electronic apparatus 30 viewed from the side of a side surface 33. As illustrated in FIG. 2C, the electronic apparatus 30 includes a front imaging module 51 for capturing an image of a subject on the front side, and a back imaging module 52 for capturing an image of a subject on the back side. That is, the electronic apparatus 30 includes at least two imaging devices 10.

Such a configuration may hinder reduction in cost for manufacturing the electronic apparatus 30 and reduction in size of the casing thereof. Also, in the case of simultaneously driving both the imaging devices 10, for example, in the case of capturing an image of a subject by using the imaging device 10 on the back side while detecting illuminance by using the imaging device 10 on the front side, the two imaging devices 10 are simultaneously driven, which makes it difficult to reduce power consumption.

Japanese Patent No. 4000449 discloses an imaging device that captures images of subjects on the front-surface side and back-surface side, but merely describes that the same photoelectric conversion element is used for both sides.

In the present disclosure, the configuration of an imaging device that captures images of subjects on the front-surface side and the back-surface side is disclosed in further detail, thereby describing an imaging device having an improved imaging performance.

Front-and-Back-Illuminated Imaging Device

FIG. 3 is a diagram illustrating an example configuration of a front-and-back-illuminated imaging device 100 (hereinafter simply referred to as "imaging device 100"). The imaging device 100 illustrated in FIG. 3 is a front-and-back-illuminated CMOS image sensor that includes light receiving portions respectively formed on the front and back surfaces of the same silicon substrate, and that is driven when light incident on the front surface and light incident on the back surface are collected to the same photodiode.

A photodiode 121, which performs photoelectric conversion on incident light, is formed in a silicon substrate 111 of the imaging device 100. In FIG. 3, the left side is a front-surface side, and the right side is a back-surface side.

A planarizing film 122 for planarizing the interface of the back surface of the silicon substrate 111, a color filter 123 through which a component of a certain wavelength range (color) of incident light passes, and an on-chip lens 124 for causing incident light to be collected onto the back-surface side of the photodiode 121, are stacked on the back-surface side of the silicon substrate 111.

A wiring layer 112 including a plurality of layers of wiring elements 131 is formed on the front-surface side of the silicon substrate 111. The wiring elements 131 are provided for a circuit which reads charges stored in the photodiode 121. An electrode portion 132, which serves as an external terminal for the circuit, is formed on the front-surface side of the wiring layer 112. The electrode portion 132 is exposed on the back-surface side.

The front-surface side of the wiring layer 112 and the electrode portion 132 is provided with a passivation film 141 so as to be protected. The photodiode 121 is irradiated with light incident on the front-surface side. Thus, the wiring elements 131 are disposed in a region in the wiring layer 112 other than a region serving as a path for incident light. For example, as illustrated in FIG. 3, the wiring elements 131 are disposed in a region in the wiring layer 112 other than a region extending from a color filter 144 (on-chip lens 145), which will be described below, to the photodiode 121.

In the region serving as the path for light incident on the front-surface side in the wiring layer 112, a hole is formed from the front-surface side, the passivation film 141 is formed, and then a waveguide 142 is formed. The waveguide 142 is made of a certain material, for example, a resin having a high refractive index or a silicon nitride (SiN) film. The waveguide 142 causes total reflection on a boundary surface other than a surface through which light comes in or out, due to a difference in refractive index from the surrounding portion, and thereby transmits light with high efficiency.

A planarizing film 143, the color filter 144, and the on-chip lens 145 are further stacked on the front-surface side of the waveguide 142 and the passivation film 141. These are provided for light incident on the front-surface side. Furthermore, a transparent support substrate 146, through which light passes, is bonded or adhered to the front-surface side of the on-chip lens 145.

With this configuration, light enters the photodiode 121 from both of the front-surface side and the back-surface side.

The photodiode 121 is capable of performing photoelectric conversion on the light entered from both of the front-surface side and the back-surface side. That is, in the imaging device 100, the same photoelectric conversion element performs photoelectric conversion on light incident on the front-surface side and light incident on the back-surface side. Furthermore, in the imaging device 100, the wiring elements 131 may be shared by the front-surface side and the back-surface side. Accordingly, the imaging device 100 may be reduced in size. Also, the cost for manufacturing the imaging device 100 may be reduced compared to the case of individually manufacturing two imaging devices.

In the imaging device 100, the wiring layer 112 is formed on one side (front-surface side) of the silicon substrate 111. Thus, light incident on the back-surface side of the imaging device 100 passes through the on-chip lens 124, the color filter 123, and the planarizing film 122 to enter the photodiode 121, and undergoes photoelectric conversion. That is, light incident on the back-surface side of the imaging device 100 enters the photodiode 121 without going through the wiring layer 112. Thus, the photoelectric conversion sensitivity on the back-surface side of the imaging device 100 may be increased.

Furthermore, since the waveguide 142 is formed in the wiring layer 112, as described above, the photoelectric conversion sensitivity on the front-surface side of the imaging device 100 may also be increased.

With the waveguide 142 being provided, light incident on the front-surface side of the imaging device 100 travels along the waveguide 142 to enter the photodiode 121. Thus, leakage of light into adjacent pixels is suppressed. That is, the waveguide 142 is capable of suppressing the occurrence of color mixture caused by light incident on the front-surface side. In addition, the waveguide 142 is capable of suppressing the occurrence of color mixture caused by light incident on the back-surface side of the imaging device 100.

Figure 4A:
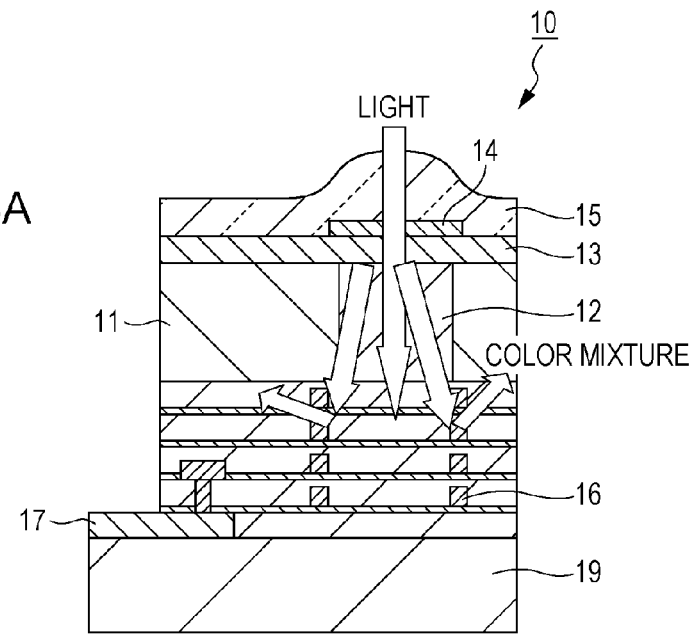
FIGS. 4A and 4B are diagrams illustrating a difference between light paths for incident light in a case where a waveguide does not exist and in a case where a waveguide exists.

If the waveguide 142 is not provided, as illustrated in FIG. 4A, light incident on the back-surface side may pass through the photodiode 12, be reflected by the wiring elements 16, and enter the photodiode 12 of an adjacent pixel. That is, color mixture may occur.

Figure 4B:
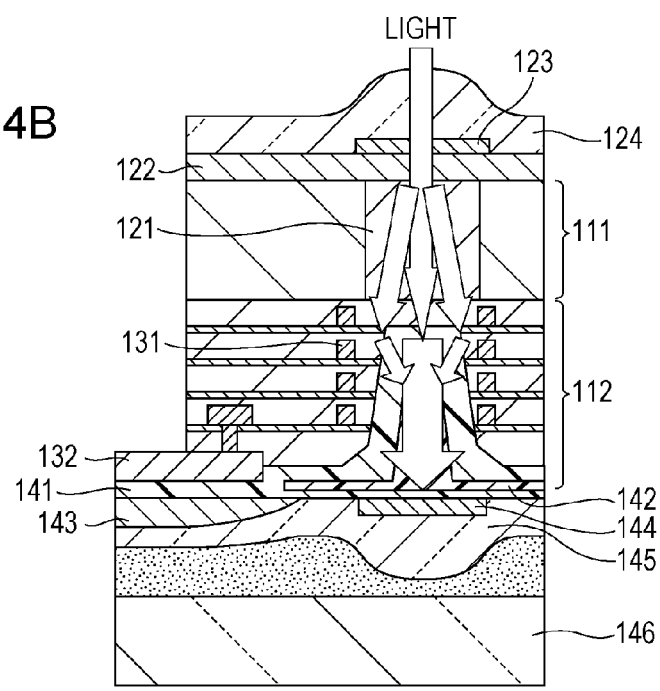

In contrast, in the imaging device 100 illustrated in FIG. 4B, light incident on the back-surface side passes through the photodiode 121 to enter the waveguide 142, and is thus transmitted to the front-surface side without being reflected by the wiring elements 131. Accordingly, the occurrence of color mixture is suppressed.

As the size of pixels decreases, color mixture is more likely to occur. Accordingly, the effect obtained by suppressing the occurrence of color mixture by using the waveguide 142 increases.

A circuit used when the photodiode 121 performs photoelectric conversion on light incident on the front-surface side and a circuit used when the photodiode 121 performs photoelectric conversion on light incident on the back-surface side may be individually provided, instead of sharing the wiring elements 131. In this case, both the circuits may be operated independently from each other, but the redundancy of circuits increases because two circuits having substantially the same configuration are provided.

Furthermore, as a result of causing circuits, such as the photodiode 121, a transistor, and the wiring elements 131, to be shared, the number of steps in a manufacturing process may be decreased. Accordingly, the manufacturing cost may be decreased compared to the case of individually manufacturing two imaging devices.

As illustrated in FIG. 3, the silicon substrate 111 and the elements on the front-surface side of the silicon substrate 111 form a front-illuminated image sensor. The silicon substrate 111 and the elements on the back-surface side of the silicon substrate 111 form a back-illuminated image sensor.

The imaging device 100 may be manufactured by forming, on the back-surface side of a front-illuminated image sensor, the elements on the back-surface side of the silicon substrate 111 of a back-illuminated image sensor (planarizing film 122, color filter 123, and on-chip lens 124). Note that the opening direction of the electrode portion 132 is the back-surface side. In other words, the imaging device 100 may be manufactured by forming, on the front-surface side of the wiring layer 112 of the back-illuminated image sensor, the elements on the front-surface side of the wiring layer 112 of the front-illuminated image sensor (passivation film 141, waveguide 142, planarizing film 143, color filter 144, on-chip lens 145, and transparent support substrate 146).

That is, the imaging device 100 may be easily manufactured by using the method for manufacturing an imaging device according to the related art.

Manufacturing Method

Hereinafter, an example of the method for manufacturing the imaging device 100 will be described.

Figure 5:
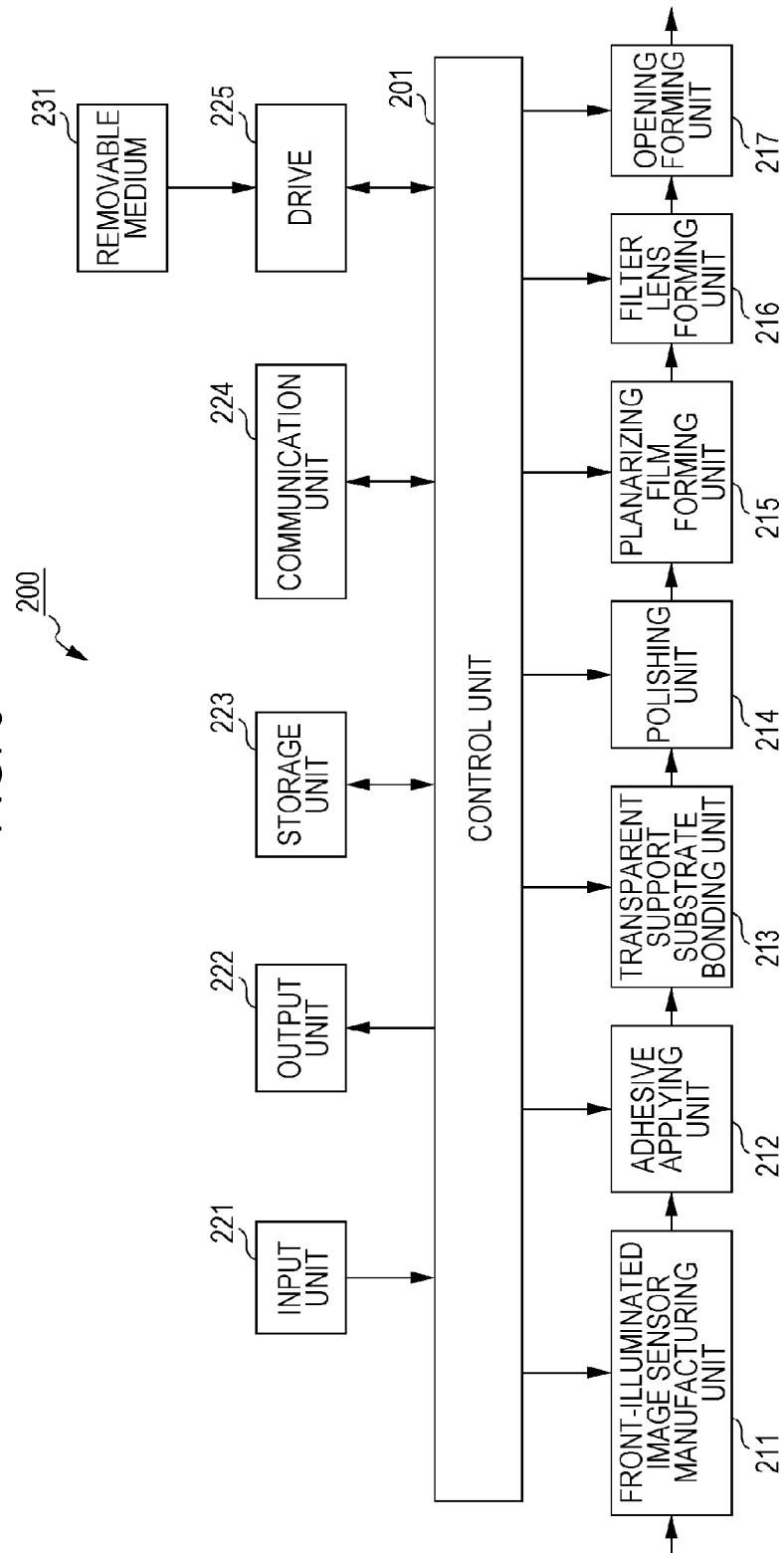
FIG. 5 is a block diagram illustrating an example configuration of a manufacturing apparatus.

FIG. 5 is a block diagram illustrating an example configuration of a manufacturing apparatus 200 for manufacturing the imaging device 100. As illustrated in FIG. 5, the manufacturing apparatus 200 includes a control unit 201, a front-illuminated image sensor manufacturing unit 211, an adhesive applying unit 212, a transparent support substrate bonding unit 213, a polishing unit 214, a planarizing film forming unit 215, a filter lens forming unit 216, and an opening forming unit 217. Also, the manufacturing apparatus 200 includes an input unit 221, an output unit 222, a storage unit 223, a communication unit 224, and a drive 225.

The control unit 201 includes, for example, a central processing unit (CPU), a read only memory (ROM), and a random access memory (RAM), controls the other units, and performs a process of manufacturing the imaging device 100. For example, the CPU of the control unit 201 executes various processes in accordance with a program stored in the ROM. Also, the CPU executes various processes in accordance with a program loaded to the RAM from the storage unit 223. The RAM stores data that is necessary for the CPU to execute the various processes as appropriate.

The front-illuminated image sensor manufacturing unit 211, the adhesive applying unit 212, the transparent support substrate bonding unit 213, the polishing unit 214, the planarizing film forming unit 215, the filter lens forming unit 216, and the opening forming unit 217 are controlled by the control unit 201, and perform steps for manufacturing the imaging device 100.

The input unit 221 includes a keyboard, a mouse, a touch panel, and an external input terminal, accepts input of a user instruction and information from the outside, and supplies them to the control unit 201. The output unit 222 includes a display, such as a cathode ray tube (CRT) display or a liquid crystal display (LCD), a speaker, and an external output terminal, and outputs various pieces of information supplied from the control unit 201 in the form of an image, voice, an analog signal, or digital data.

The storage unit 223 includes a solid state drive (SSD), such as a flash memory, a hard disk, or the like. The storage unit 223 stores information supplied from the control unit 201, and reads and supplies information stored therein in response to a request from the control unit 201.

The communication unit 224 includes an interface and a modem for a wired local area network (LAN) or a wireless LAN, and communicates with an external apparatus via a network including the Internet. For example, the communication unit 224 transmits information supplied from the control unit 201 to an external apparatus, and supplies information received from an external apparatus to the control unit 201.

The drive 225 is connected to the control unit 201 when it is necessary. A removable medium 231, such as a magnetic disk, an optical disc, a magneto-optical disc, or a semiconductor memory, is loaded into the drive 225 as appropriate. Then, a compute program read from the removable medium 231 via the drive 225 is installed into the storage unit 223 when it is necessary.

Figure 6:
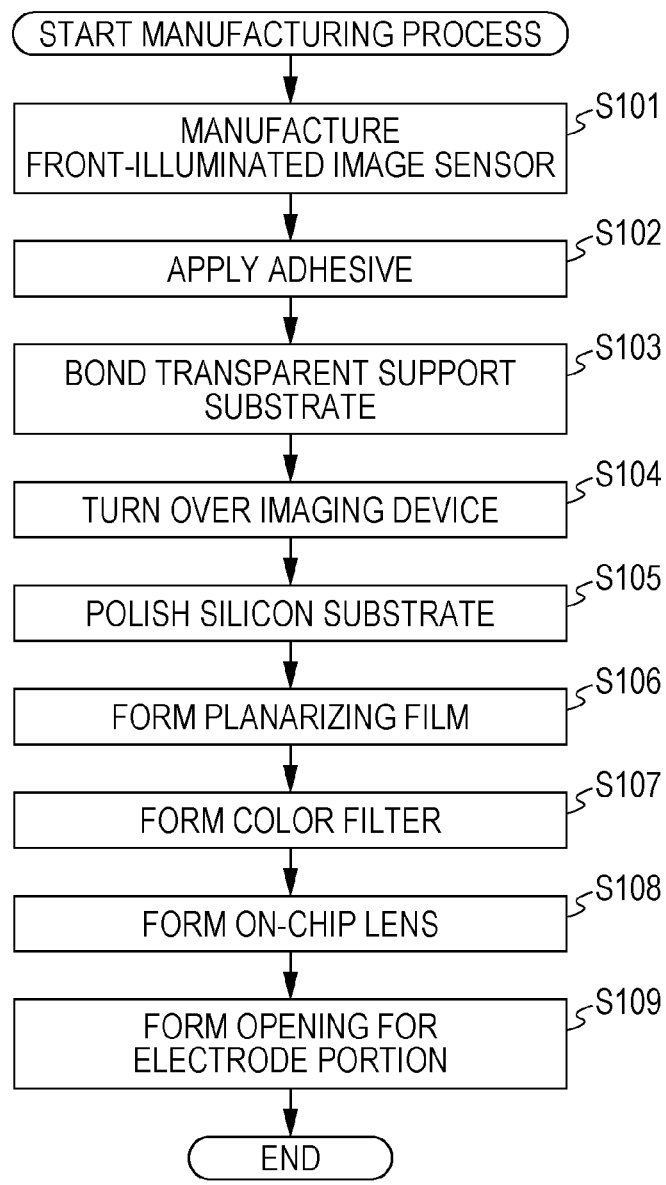
FIG. 6 is a flowchart illustrating an example of a flow of a manufacturing process.
Figure 7:
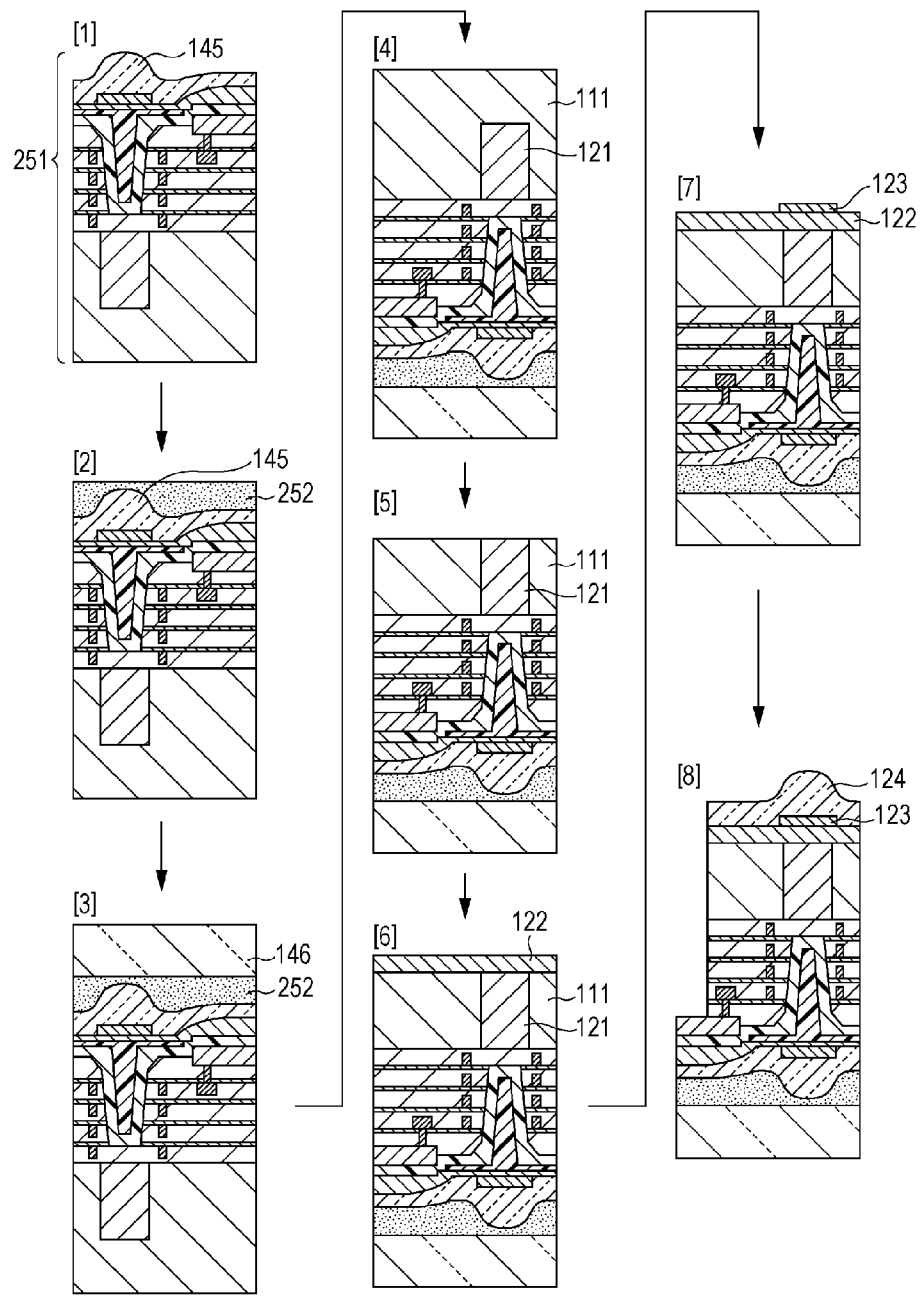
FIG. 7 is a diagram illustrating states in individual steps of the manufacturing process.

An example of a flow of a manufacturing process will be described with reference to the flowchart in FIG. 6. The description will be given with reference to FIG. 7 as appropriate. FIG. 7 is a diagram illustrating the states in individual steps of the manufacturing process.

Upon the manufacturing process being started, in step S101, the front-illuminated image sensor manufacturing unit 211 manufactures a front-illuminated image sensor 251 having a waveguide formed in a wiring layer by using a method according to the related art, such as the method described in Japanese Unexamined Patent Application Publication No. 2010-41034, in accordance with control performed by the control unit 201. Step S101 corresponds to step (1) in FIG. 7.

In step S102, the adhesive applying unit 212 applies a certain adhesive 252 onto a surface of the on-chip lens 145 in accordance with control performed by the control unit 201. Step S102 corresponds to step (2) in FIG. 7.

In step S103, the transparent support substrate bonding unit 213 bonds the transparent support substrate 146 in accordance with control performed by the control unit 201. Step S103 corresponds to step (3) in FIG. 7.

In step S104, the polishing unit 214 turns over the imaging device 100 obtained through the above-described steps, in accordance with control performed by the control unit 201. Step S104 corresponds to step (4) in FIG. 7. In step S105, the polishing unit 214 polishes the back surface of the silicon substrate 111 in accordance with control performed by the control unit 201. Step S105 corresponds to step (5) in FIG. 7. Polishing may be performed by back grinding, or may be performed by etching to reduce pressure applied to the color filter 144 and the on-chip lens 145.

The subsequent steps may be performed in a manner similar to that of a method for manufacturing a back-illuminated image sensor according to the related art, for example, the method described in Japanese Unexamined Patent Application Publication No. 2008-103368.

In step S106, the planarizing film forming unit 215 forms the planarizing film 122 on the interface of the polished back surface of the silicon substrate 111 in accordance with control performed by the control unit 201. Step S106 corresponds to step (6) in FIG. 7.

In step S107, the filter lens forming unit 216 forms the color filter 123 on the back-surface side of the planarizing film 122 in accordance with control performed by the control unit 201. Step S107 corresponds to step (7) in FIG. 7. In step S108, the filter lens forming unit 216 forms the on-chip lens 124 in accordance with control performed by the control unit 201. Step S108 corresponds to step (8) in FIG. 7.

In step S109, the opening forming unit 217 forms an opening by removing a part of the silicon substrate 111 and the wiring layer 112 from their back-surface side, so as to allow the electrode portion 132 to be exposed on the back-surface side, in accordance with control performed by the control unit 201.

After step S109 ends, the control unit 201 ends the manufacturing process.

As described above, the manufacturing apparatus 200 is capable of manufacturing the imaging device 100 more easily by using the method for manufacturing an imaging device according to the related art.

Wider Range of Applications

According to the description given above, a color filter is formed. This filter may be an RGB color filter or may be a filter for a white pixel. The wavelength range of light which enters the photodiode 121 may include the wavelength of light other than visible light, such as infrared light. That is, the filter may be an infrared transmitting filter which allows infrared light to pass therethrough.

As illustrated in FIG. 3, light incident on the back-surface side enters the photodiode 121 without going through the wiring layer 112. Thus, the sensitivity of the photodiode 121 is higher for light incident on the back-surface side. Thus, for example, the configuration on the back-surface side of the imaging device 100 may be used for capturing an image by obtaining visible light, and the configuration on the front-surface side thereof may be used for other applications, such as detection of infrared light and detection of illuminance.

Figure 8:
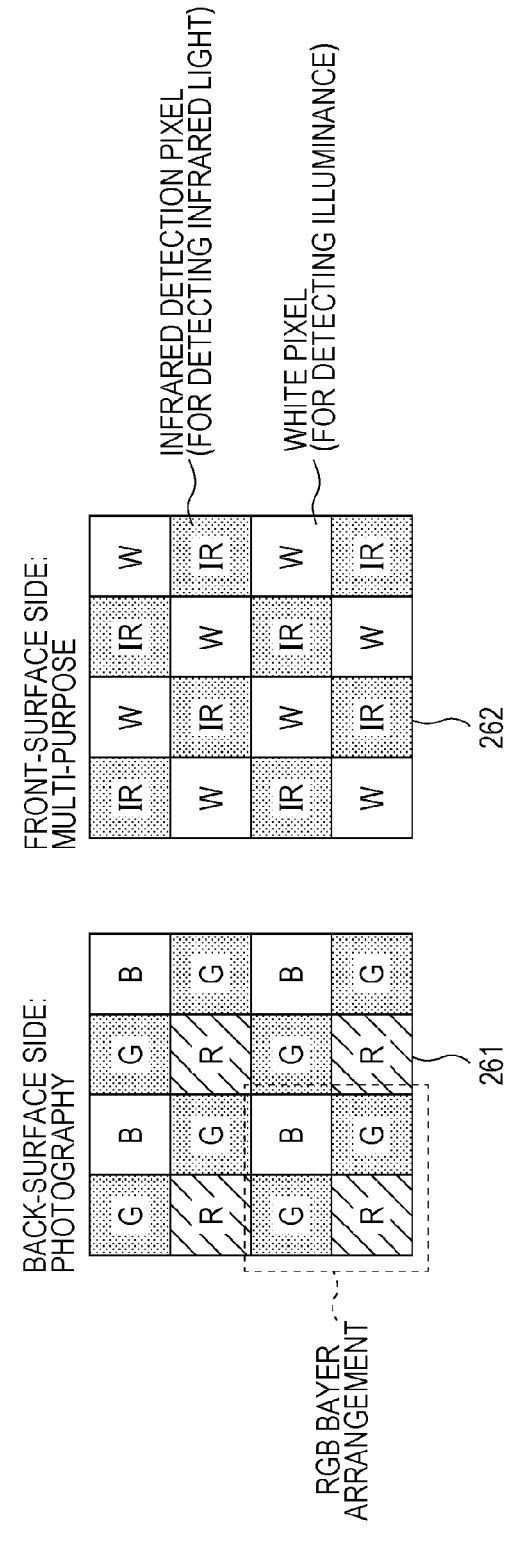
FIG. 8 is a diagram illustrating an example of filters.

FIG. 8 is a diagram illustrating an example configuration of filters provided on the front-surface side and the back-surface side of the imaging device 100, respectively. In the example illustrated in FIG. 8, a color filter 261 having an RGB Bayer arrangement is formed on the pixels on the back-surface side, and a multipurpose filter 262, in which infrared transmitting filters and white-pixel filters are arranged in a predetermined pattern, is formed on the pixels on the front-surface side.

In this case, the imaging device 100 is capable of capturing an RGB image by obtaining visible light by using the configuration on the back-surface side, and is capable of detecting infrared light and detecting illuminance by using the configuration on the front-surface side. In this way, the imaging device 100 may be used for a wider range of applications.

The configuration of filters is not limited to that illustrated in FIG. 8. For example, a filter constituted by only infrared transmitting filters or only white-pixel filters may be used as the filter on the front-surface side, instead of the multipurpose filter 262. Of course, RGB color filters may be mixed thereto, or another type of filter may be used. Furthermore, the color filter 261 may be used as the filter on the front-surface side, and the multipurpose filter 262 may be used as the filter on the back-surface side.

Another Example Configuration on Front-Surface Side

Figure 9:
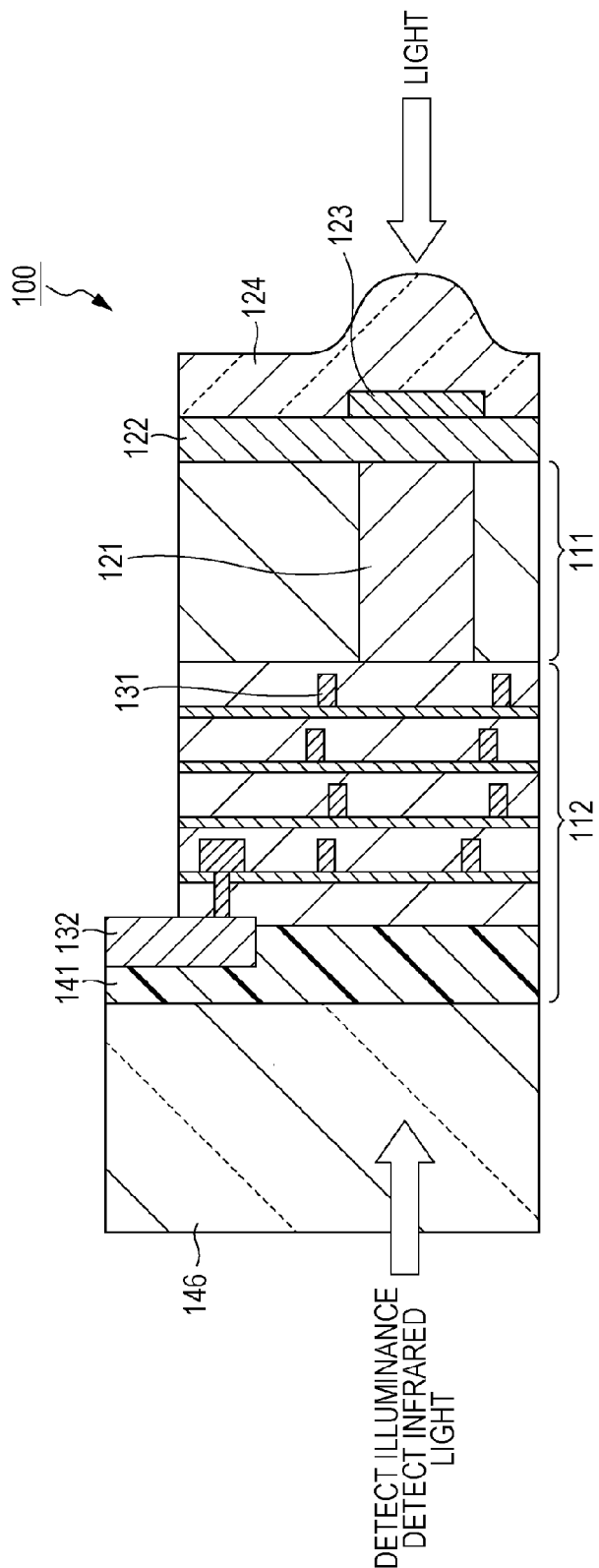
FIG. 9 is a diagram illustrating another example configuration of the front-and-back-illuminated imaging device.

In the case of capturing an image by obtaining visible light on one side and detecting infrared light and illuminance on the other side, as in the example illustrated in FIG. 8, the on-chip lens 145 and so forth in the imaging device 100 may be omitted, as illustrated in FIG. 9.

In the example illustrated in FIG. 9, the imaging device 100 captures an RGB image by obtaining visible light on the back-surface side, and detects illuminance and infrared light on the front-surface side. The on-chip lens 145, which collects incident light, is not necessary for detecting illuminance and infrared light. Thus, the imaging device 100 illustrated in FIG. 9 does not include the waveguide 142, the planarizing film 143, the color filter 144, and the on-chip lens 145. Accordingly, the imaging device 100 may be manufactured with a reduced number of materials and a reduced number of steps, and the manufacturing cost may be reduced. Furthermore, the simplified structure on the front-surface side may reduce the risk of deformation of material of the imaging device 100 caused by pressure.

Manufacturing Method

Figure 10:
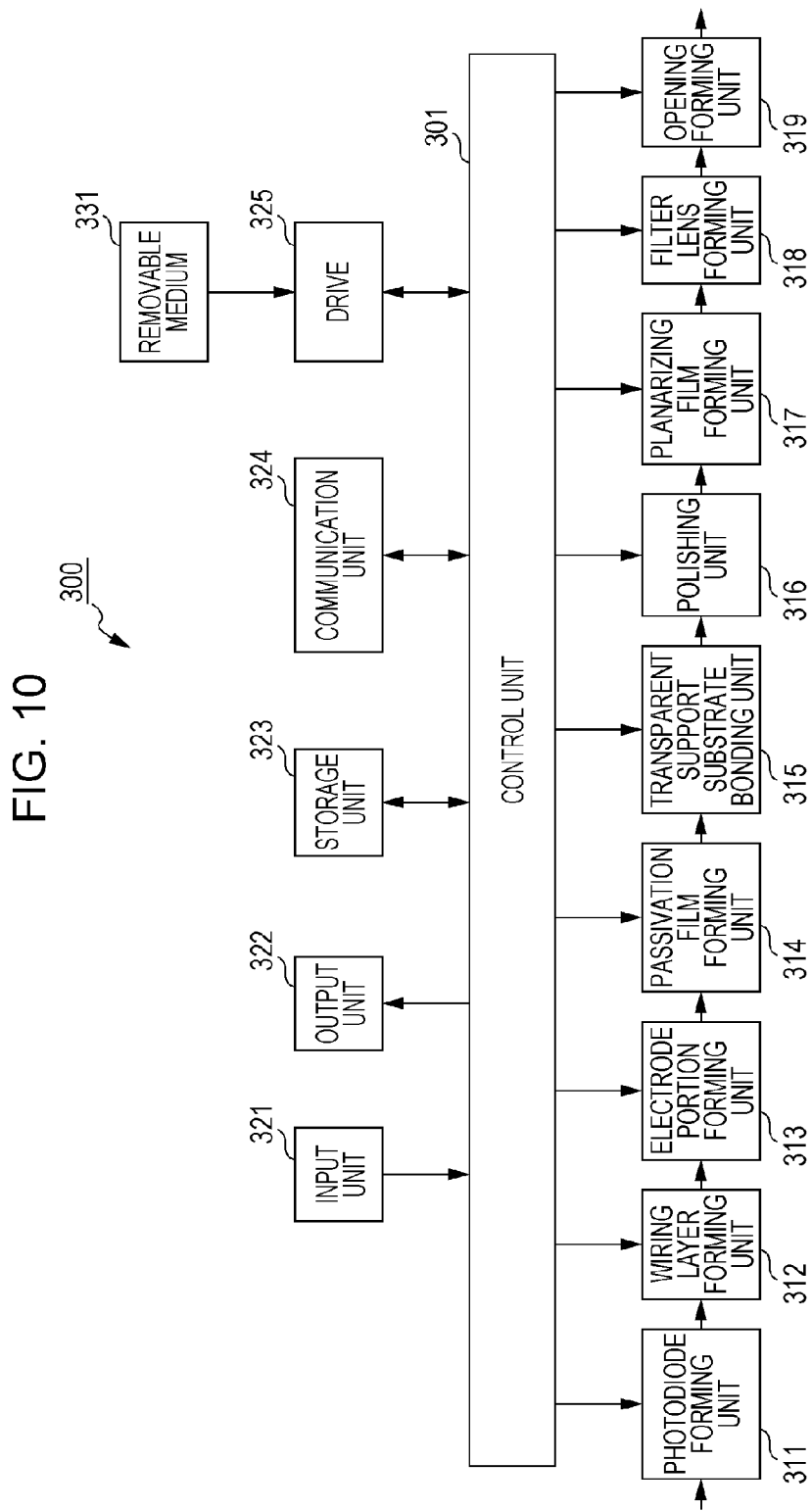
FIG. 10 is a block diagram illustrating another example configuration of a manufacturing apparatus.

FIG. 10 is a block diagram illustrating an example configuration of a manufacturing apparatus 300 in this case. The manufacturing apparatus 300 illustrated in FIG. 10 is an apparatus for manufacturing the imaging device 100 illustrated in FIG. 9. As illustrated in FIG. 10, the manufacturing apparatus 300 includes a control unit 301, a photodiode forming unit 311, a wiring layer forming unit 312, an electrode portion forming unit 313, a passivation film forming unit 314, a transparent support substrate bonding unit 315, a polishing unit 316, a planarizing film forming unit 317, a filter lens forming unit 318, and an opening forming unit 319. The control unit 301 is a processing unit similar to the control unit 201 illustrated in FIG. 5.

The manufacturing apparatus 300 further includes an input unit 321, an output unit 322, a storage unit 323, a communication unit 324, and a drive 325, which are processing units similar to the input unit 221, the output unit 222, the storage unit 223, the communication unit 224, and the drive 225 illustrated in FIG. 5, respectively. A removable medium 331 is a medium similar to the removable medium 231 illustrated in FIG. 5.

The photodiode forming unit 311, the wiring layer forming unit 312, the electrode portion forming unit 313, the passivation film forming unit 314, the transparent support substrate bonding unit 315, the polishing unit 316, the planarizing film forming unit 317, the filter lens forming unit 318, and the opening forming unit 319 are controlled by the control unit 301, and execute the individual steps for manufacturing the imaging device 100.

Figure 11:
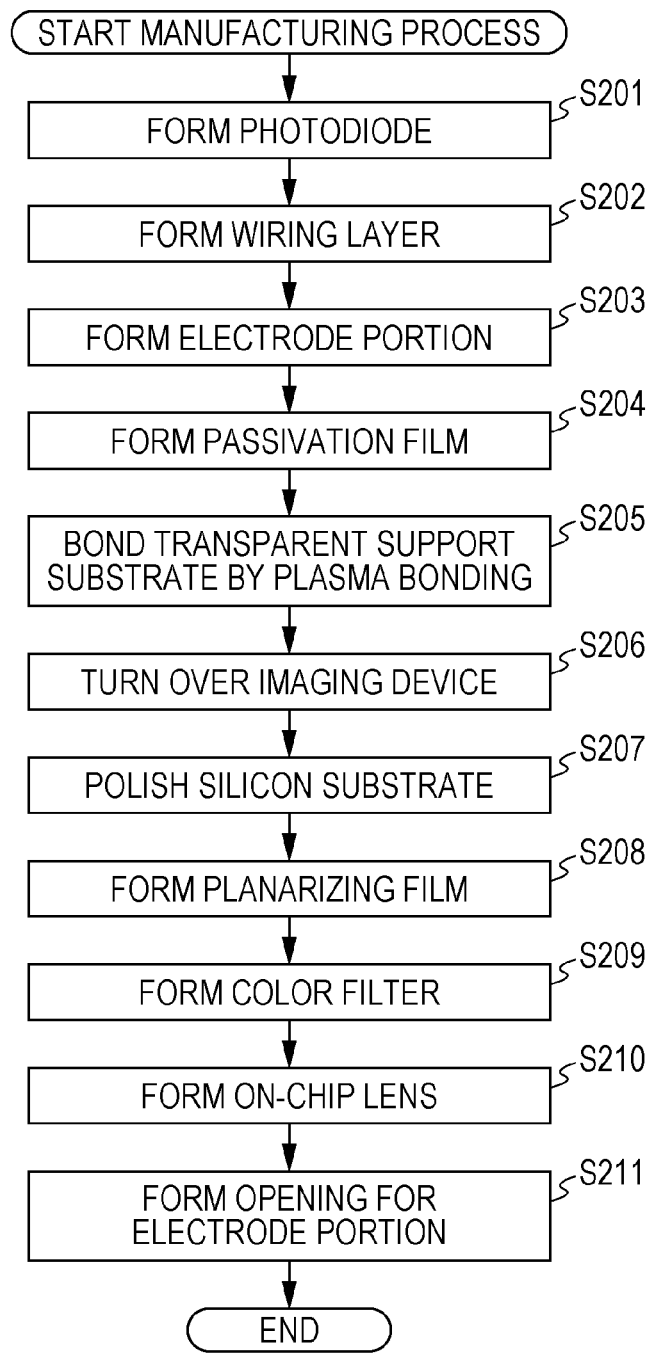
FIG. 11 is a flowchart illustrating another example of a flow of a manufacturing process.
Figure 12:
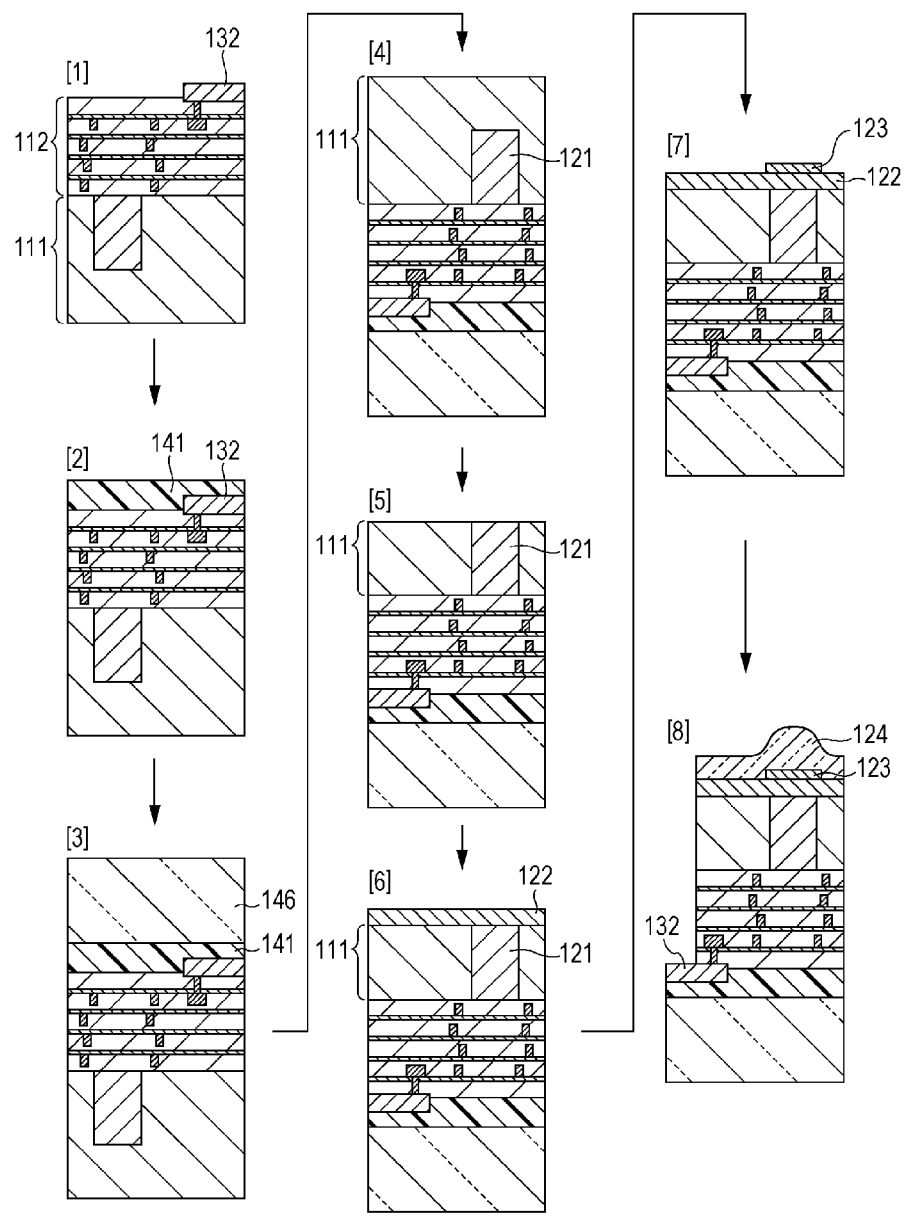
FIG. 12 is a diagram illustrating states in individual steps of the manufacturing process.

An example of a flow of a manufacturing process in this case will be described with reference to the flowchart in FIG. 11. The description will be given with reference to FIG. 12 as appropriate.

Upon the manufacturing process being started, in step S201, the photodiode forming unit 311 forms the photodiode 121 in the silicon substrate 111 in accordance with control performed by the control unit 301. In step S202, the wiring layer forming unit 312 forms the wiring layer 112 on the front-surface side of the silicon substrate 111 in accordance with control performed by the control unit 301. In step S203, the electrode portion forming unit 313 forms the electrode portion 132 on the front-surface side of the wiring layer 112 in accordance with control performed by the control unit 301. Steps S201 to S203 correspond to step (1) in FIG. 12.

In step S204, the passivation film forming unit 314 forms the passivation film 141, which is made of a silicon nitride (SiN) film or the like, on the front-surface side of the wiring layer 112 and the electrode portion 132 in accordance with control performed by the control unit 301. Step S204 corresponds to step (2) in FIG. 12.

In step S205, the transparent support substrate bonding unit 315 bonds the transparent support substrate 146 to the passivation film 141 by plasma bonding in accordance with control performed by the control unit 301. Step S205 corresponds to step (3) in FIG. 12. In this case, the passivation film 141 is relatively flat, and thus bonding using plasma bonding may be easily performed. The transparent support substrate 146 may be bonded to the passivation film 141 by using an adhesive member instead of using plasma bonding. In this case, however, the adhesive member may cause absorption or refraction of light. That is, light collection efficiency may decrease, and the sensitivity of the image sensor may degrade. In contrast, in the case of using plasma bonding, such absorption or refraction of light does not occur, and the photodiode 121 may be kept highly sensitive.

In the manufacturing method described above with reference to FIGS. 5 to 7, the transparent support substrate 146 is bonded by using an adhesive. In this case, the front-surface side is not flat because the on-chip lens 145 is formed thereon, and thus bonding may be performed more easily by using an adhesive than plasma bonding.

In step S206, the polishing unit 316 turns over the imaging device 100 obtained through the above-described steps in accordance with control performed by the control unit 301. Step S206 corresponds to step (4) in FIG. 12. In step S207, the polishing unit 316 polishes the back surface of the silicon substrate 111 in accordance with control performed by the control unit 301. Step S207 corresponds to step (5) in FIG. 12.

In step S208, the planarizing film forming unit 317 forms the planarizing film 122 on the interface of the polished back surface of the silicon substrate 111 in accordance with control performed by the control unit 301. Step S208 corresponds to step (6) in FIG. 12.

In step S209, the filter lens forming unit 318 forms the color filter 123 on the back-surface side of the planarizing film 122 in accordance with control performed by the control unit 301. Step S209 corresponds to step (7) in FIG. 12. In step S210, the filter lens forming unit 318 forms the on-chip lens 124 in accordance with control performed by the control unit 301. Step S210 corresponds to step (8) in FIG. 12.

In step S211, the opening forming unit 319 forms an opening by removing a part of the silicon substrate 111 and the wiring layer 112 from their back-surface side, so as to allow the electrode portion 132 to be exposed on the back-surface side, in accordance with control performed by the control unit 301.

After step S211 ends, the control unit 301 ends the manufacturing process.

As described above, the manufacturing apparatus 300 is capable of manufacturing the imaging device 100 more easily by using the method for manufacturing an imaging device according to the related art.

Vertical Spectroscopic Structure

Figure 13:
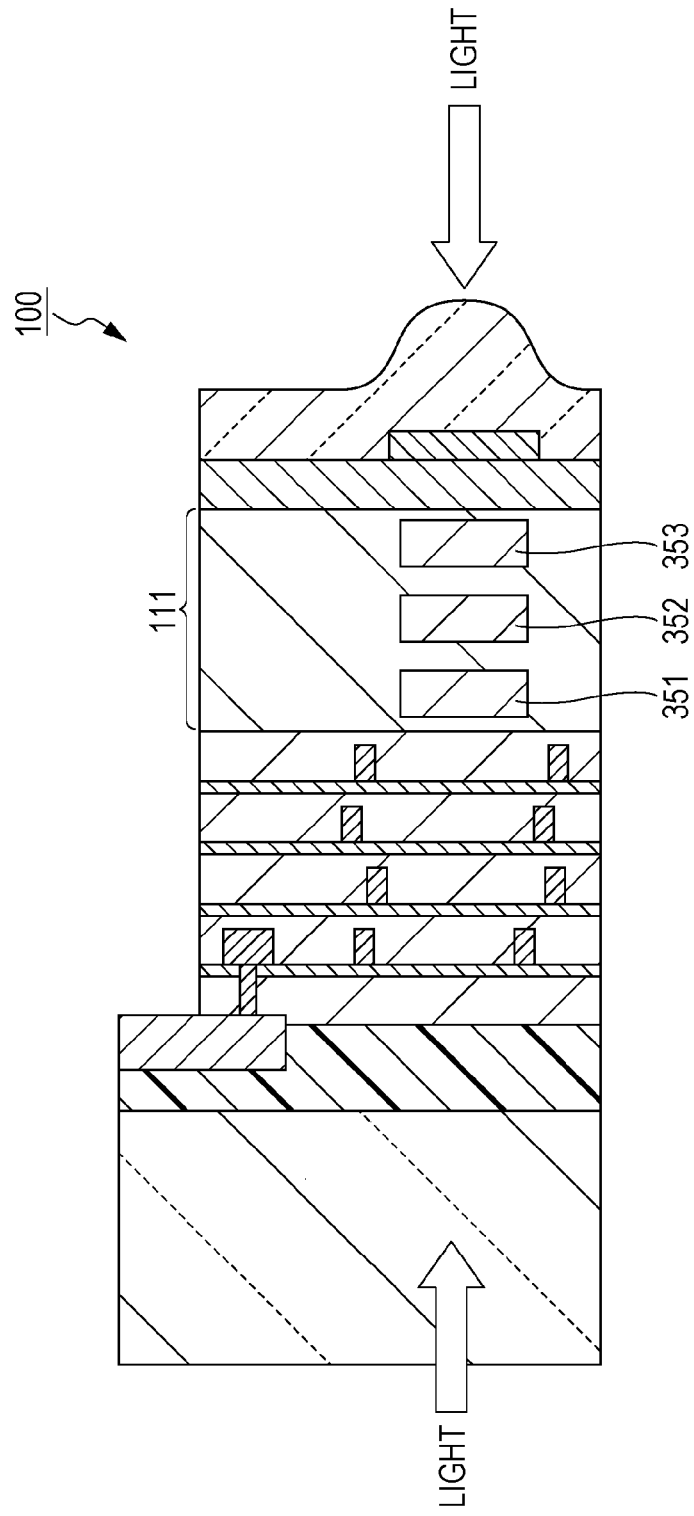
FIG. 13 is a diagram illustrating still another example configuration of the front-and-back-illuminated imaging device.

A vertical spectroscopic structure may be employed for the silicon substrate 111 of the imaging device 100, as illustrated in FIG. 13, and a color filter may be not used for each pixel.

In the imaging device 100 illustrated in FIG. 13, photodiodes 351 to 353 are formed in the silicon substrate 111. Each photodiode performs photoelectric conversion on a component of incident light in a wavelength range corresponding to the depth of the photodiode. A method for forming a vertical spectroscopic structure is disclosed in, for example, Japanese Unexamined Patent Application Publication No. 2011-29453. In such a vertical spectroscopic structure, a plurality of color components are detected in each pixel. Thus, in a case where the same organic photoelectric conversion film is formed on all the pixels, mixture of different colors of pixels adjacent to each other, which may be caused by pressure, does not occur unlike in the case of using color filters.

With such a vertical spectroscopic structure, the imaging device 100 does not include color filters, and the structure thereof is simplified. Accordingly, the resistance to pressure applied during manufacturing may be increased.

Pressure Dispersion Structure

In order to further disperse pressure, a portion outside a pixel region (for example, an electrode portion) may be higher than the pixel region. In the example illustrated in FIG.

14, an electrode portion 361, which is thicker than the electrode portion 132 illustrated in FIG. 3, is provided.

The thickness of the electrode portion 361 causes the passivation film 141, the planarizing film 143, and the on-chip lens 145 to be higher on the side where the electrode portion 361 is formed than in a pixel portion (the portion where the photodiode 121, the waveguide 142, and so forth are formed), that is, to be raised on the front-surface side.

Figure 14:
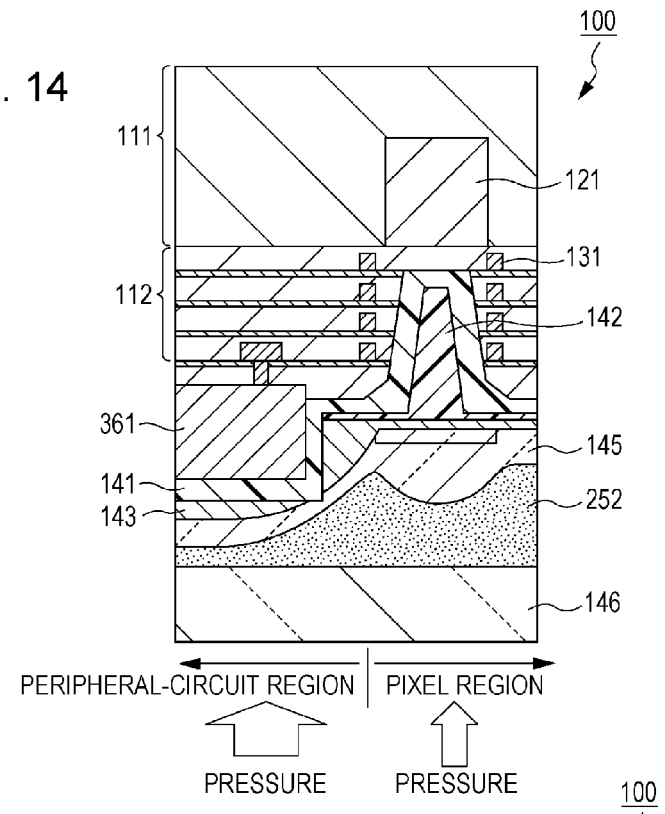
FIG. 14 is a diagram illustrating an example configuration of the front-and-back-illuminated imaging device.

With this structure, pressure may be dispersed toward the outside of the pixel region. For example, when the back surface of the silicon substrate 111 is polished to manufacture the imaging device 100, overweight may be applied to the imaging device 100, and thereby the on-chip lens 145 and the color filter 144 may be damaged. By causing a portion outside the pixel region to be high (raised), as in the example illustrated in FIG. 14, the overweight applied to the imaging device 100 may be dispersed to the surrounding region.

Measures Against Color Mixture of Filters

As described above, when the back surface of the silicon substrate 111 is polished to manufacture the imaging device 100, overweight may be applied to the imaging device 100 depending on a condition of a dicing process, and the color filter 144 and the on-chip lens 145 may be deformed.

Figure 15:
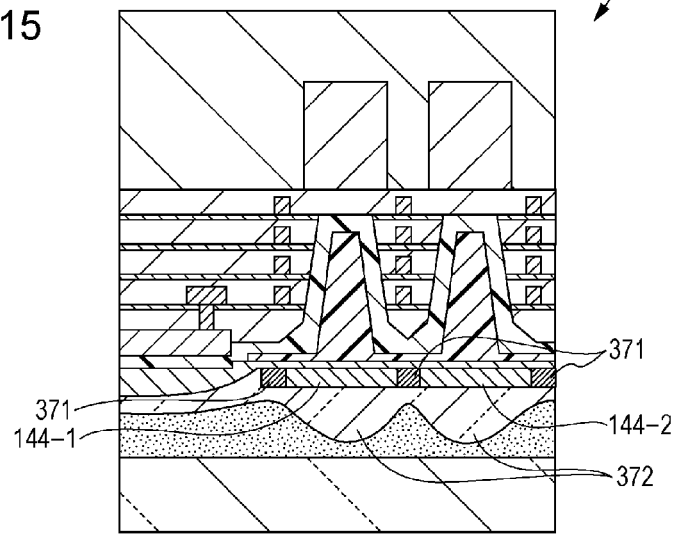
FIG. 15 is a diagram illustrating another example configuration of the front-and-back-illuminated imaging device.

As in the example illustrated in FIG. 15, the color filter 144 may be surrounded by an inorganic film, such as an oxide film or a metallic film. In the example illustrated in FIG. 15, color filters 144-1 and 144-2 are surrounded by an inorganic film 371. That is, the color filters 144-1 and 144-2, which are color filters of pixels adjacent to each other, are separated from each other by the inorganic film 371. Such a structure suppresses color mixture of color filters of pixels adjacent to each other caused by pressure.

The on-chip lens 145 may be made of an inorganic film (for example, silicon nitride (SiN)). In the example illustrated in FIG. 15, an inorganic-film on-chip lens 372, which is made of an inorganic material, is provided for each pixel, instead of the on-chip lens 145.

Also, the waveguide 142 described above with reference to FIG. 3 may be formed of an inorganic highly-refractive film, such as a silicon nitride (SiN) film. In a case where the waveguide 142 is formed by using, for example, atomic layer deposition (ALD), the waveguide 142 may be embedded with high coverage even if the diameter of the waveguide 142 is small.

Multilayer Structure

The transparent support substrate 146 of the imaging device 100 may allow light to pass therethrough at least in a pixel region. For example, as illustrated in FIG. 16, a peripheral circuit or the like may be formed in a portion adjacent to a portion outside the pixel region in the transparent support substrate 146.

In this case, as illustrated in FIG. 16, the electrode portion 132 connected to a wiring element in the wiring layer 112 may be connected to an electrode portion 382 in a circuit portion 381, which is incorporated into the transparent support substrate 146, via a through electrode 383 and a connection electrode 384. Accordingly, a multilayer structure may be realized in the imaging device 100.

Figure 17A:
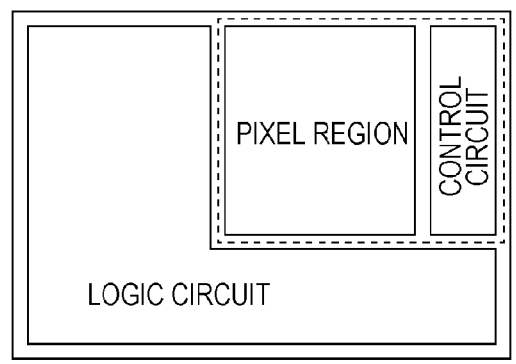
FIG. 17A is a diagram illustrating an example of a single-layer structure.
Figure 17B:
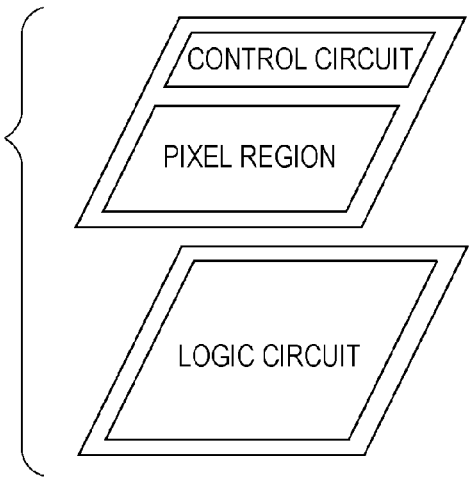
FIGS. 17B and 17C are diagrams illustrating examples of a multilayer structure.
Figure 17C:
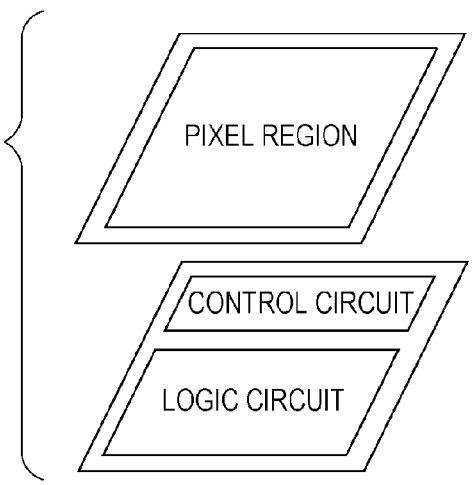

FIGS. 17B and 17C illustrate examples of an imaging device having a multilayer structure. A typical imaging device has a single-layer structure, as illustrated in FIG. 17A, in which a pixel region, a control circuit therefor, and a logic circuit are formed in the same layer.

Japanese Unexamined Patent Application Publication No. 2010-245508 describes a multilayer structure of an imaging device, in which a logic circuit is provided in a layer different from the layer in which a pixel region and a control circuit are provided, as illustrated in FIG. 17B. With such a multilayer structure, the chip size may be reduced compared to the structure illustrated in FIG. 17A.

Japanese Unexamined Patent Application Publication No. 2010-245508 also describes another multilayer structure of an imaging device, in which a logic circuit and a control circuit are provided in a layer different from the layer in which a pixel region is provided, as illustrated in FIG. 17C. With such a multilayer restructure, the size of the pixel region may be increased compared to the structure illustrated in FIG. 17B.

Figure 18:
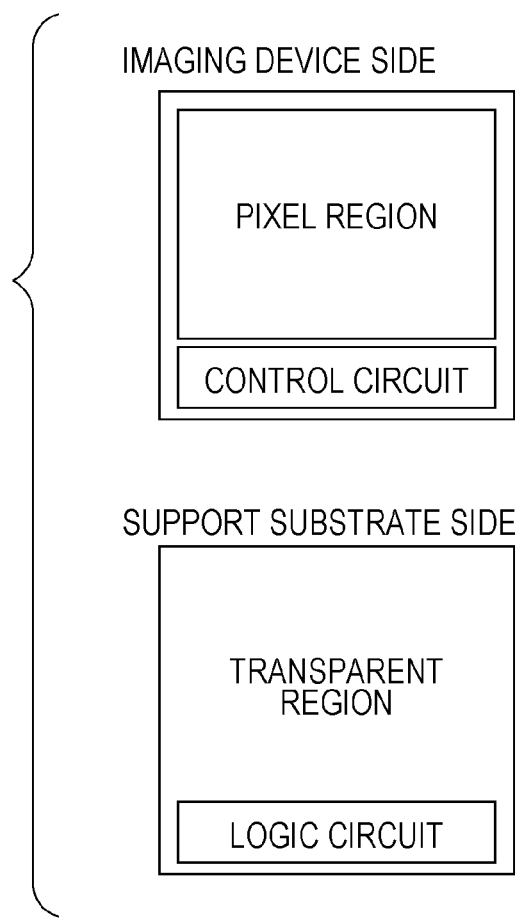
FIG. 18 is a diagram illustrating an example of a multilayer structure.

In the imaging device 100, one or both of the logic circuit and the control circuit may be provided in a layer different from the layer in which the pixel region is provided, like the above-described structures. However, as illustrated in FIG. 18, it is necessary that a region which is in a layer different from the layer provided with the pixel region and which overlaps the pixel region has a structure through which light passes (transparent region). In the example illustrated in FIG. 18, a pixel region is provided in a layer on the imaging device side. Alternatively, the pixel region may be provided in a layer on the support substrate side. In this case, a region which is in a layer on the imaging device side and which overlaps the pixel region is a transparent region.

With such a multilayer structure, the area of the imaging device 100 may be further reduced.

Pixels for One Direction

Figure 19:
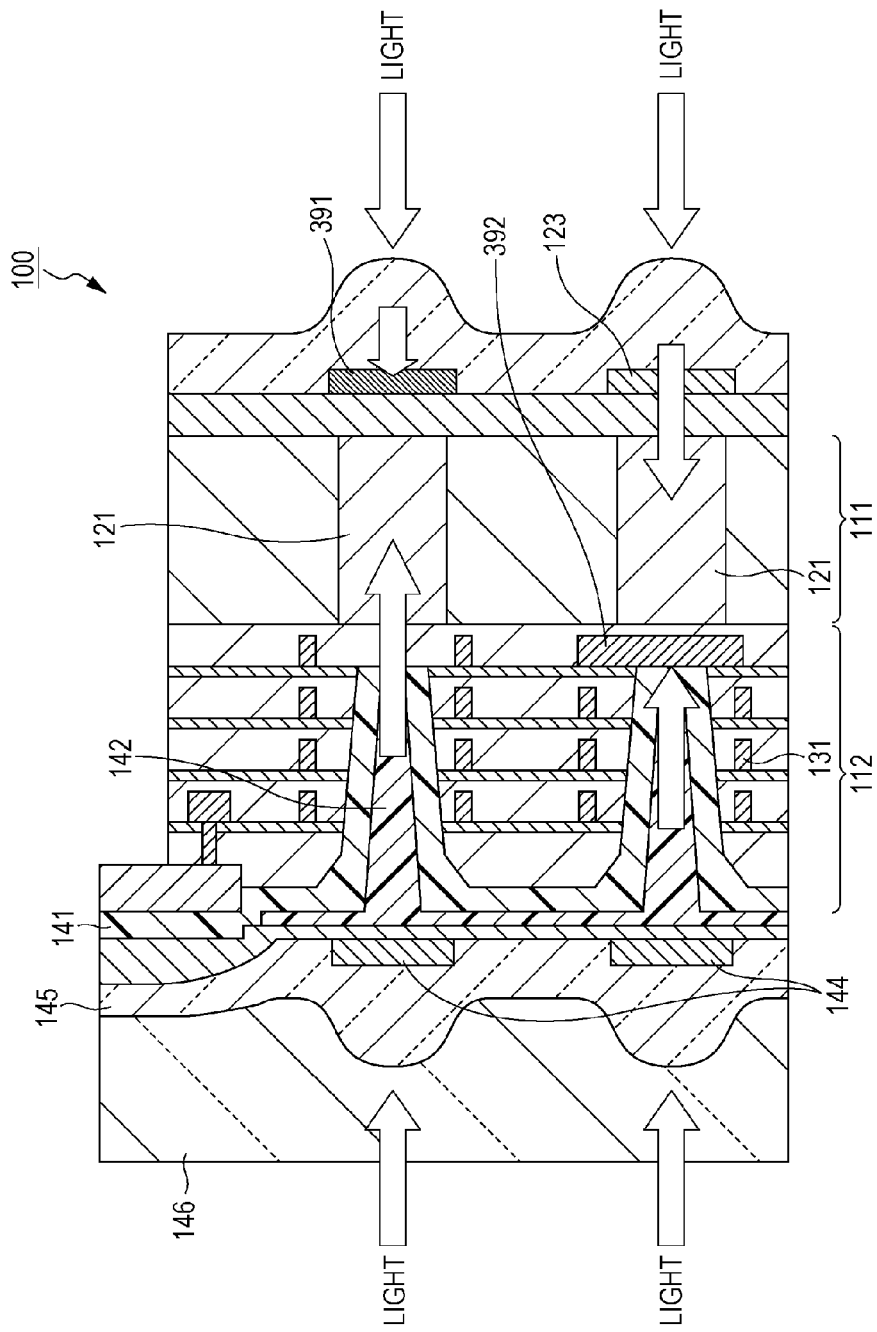
FIG. 19 is a diagram illustrating still another example configuration of the front-and-back-illuminated imaging device.

In some or all of the pixels of the imaging device 100, one of the front-surface side and the back-surface side may be shielded from light by using a light-shielding film, a wiring element, or the like. For example, as illustrated in FIG. 19, light incident on the back-surface side may be blocked by a light-shielding film 391 so that the pixel is used for capturing an image of a subject on the front-surface side, and light incident on the front-surface side may be blocked by a wiring element 392 so that the pixel is used for capturing an image of a subject on the back-surface side.

For example, a half of all the pixels may be used as pixels for capturing an image of a subject on the front-surface side, in which light incident on the back-surface side is blocked by the light-shielding film 391, and the other half may be used as pixels for capturing an image of a subject on the back-surface side, in which light incident on the front-surface side is blocked by the wiring element 392.

With this structure, image capturing on the front-surface side and image capturing on the back-surface side are performed by different pixels. Thus, the imaging device 100 is capable of simultaneously performing image capturing on the front-surface side and image capturing on the back-surface side, so as to obtain two images, an image of a subject on the front-surface side and an image of a subject on the back-surface side.

The imaging device 100 may be capable of self-recognizing the side on which light is incident, by using such pixels capable of detecting only light from one direction. By detecting the incident direction of light, the imaging device 100 is capable of detecting which of the pixels on the front-surface side and the back-surface side are being driven. For example, the imaging device 100 may change a drive method (frame rate, addition method, etc.) in accordance with the detection result.

In a case where some of the pixels are configured so as to be capable of detecting only light in one direction and to be used for determining a front-surface side or a back-surface side, such pixels may be corrected through defect correction in an image obtained through image capturing.

Figure 20:
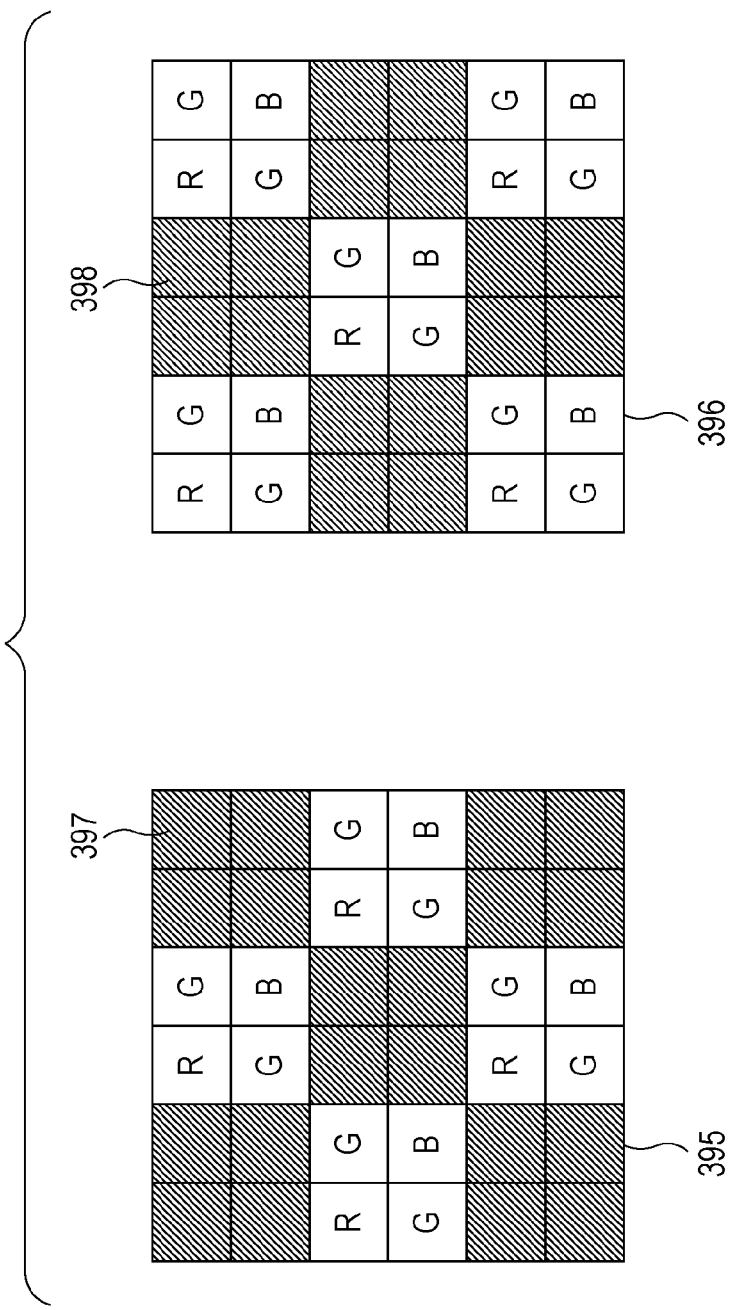
FIG. 20 is a diagram illustrating another example of filters.

The above-described block of light may be performed by using the color filters illustrated in FIG. 20. In the example illustrated in FIG. 20, some of the pixels of a front color filter 395 are shielded by a light-shielding film 397. On the other hand, regarding a back color filter 396, some of the pixels different from the pixels shielded by the light-shielding film 397 in the front color filter 395 are shielded by a light-shielding film 398.

Also in such a case where light from one direction is blocked by a filter, the imaging device 100 exerts an effect similar to that in the example illustrated in FIG. 19.

2. Second Embodiment

Imaging Module

Figure 21:
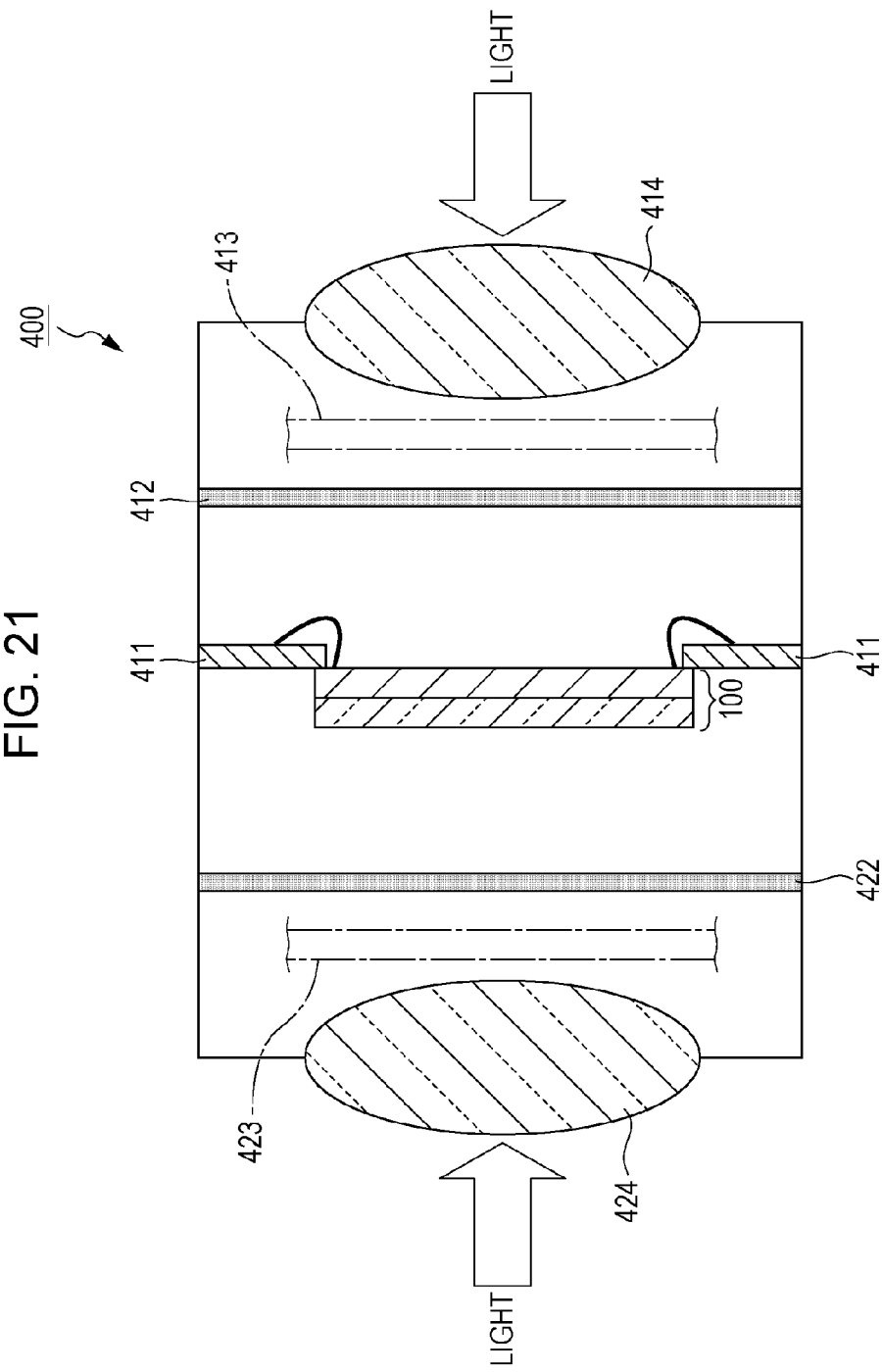
FIG. 21 is a diagram illustrating an example configuration of an imaging module.

The present technology is also applicable to an imaging module that captures images of subjects on both sides, a front-surface side and a back-surface side. FIG. 21 is a diagram illustrating an example configuration of an imaging module 400. FIG. 21 illustrates a cross section of the imaging module 400. As illustrated in FIG. 21, the imaging module 400 includes the imaging device 100. The imaging device 100 is connected to a signal processing circuit 411.

In FIG. 21, the left side is a front-surface side, and the right side is a back-surface side. An IR cut filter 412 which blocks infrared light, a shutter 413, and a light collecting lens 414 are provided on the back-surface side of the imaging device 100. Likewise, an IR cut filter 422, a shutter 423, and a light collecting lens 424 are provided on the front-surface side of the imaging device 100.

The shutters 413 and 423 control entering of light. The shutters 413 and 423 allow light to enter when they are in an open state, and block light when they are in a closed state. Typically, any one of the shutters 413 and 423 is opened at a time. In other words, the shutter on the side on which image capturing is to be performed is opened.

Of course, both of the shutters 413 and 423 may be opened at a time. The shutters 413 and 423 may be mechanical shutters, or may be liquid crystal shutters.

The light incident on the front-surface side reaches the IR cut filter 422 through the light collecting lens 424 and the shutter 423 which is in an open state. A component of the incident light which has passed through the IR cut filter 422 enters the imaging device 100 through its front surface. The light incident on the back-surface side reaches the IR cut filter 412 through the light collecting lens 414 and the shutter 413 which is in an open state. A component of the incident light which has passed through the IR cut filter 412 enters the imaging device 100 through its back surface.

In the case of using some or all of the pixels of the imaging device 100 for detecting infrared light, it is necessary to omit the IR cut filters 412 and 422.

In the case of using the imaging device 100 in an application other than the application of capturing an RGB image by obtaining visible light, for example, the application of detecting infrared light and illuminance, as described above, high resolution is not demanded. In such an application, it is not necessary to use all the pixels of the imaging device 100.

Figure 22:
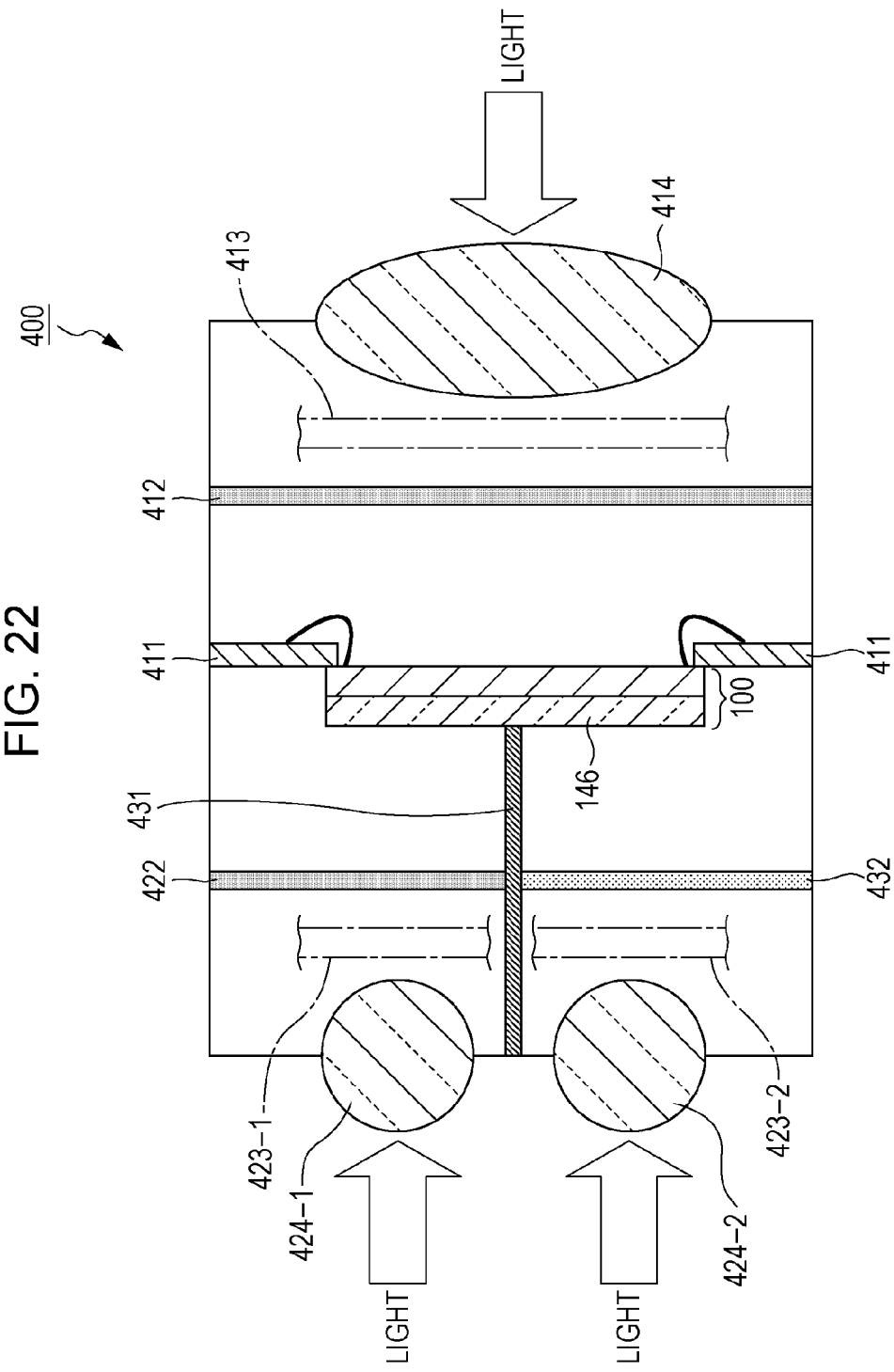
FIG. 22 is a diagram illustrating another example configuration of the imaging module.

For example, as illustrated in FIG. 22, light incident on one side or both sides may be separated by using a module structure. In the example illustrated in FIG. 22, all the pixels on the back-surface side used for capturing an image by obtaining visible light constitute one region, whereas the pixels on the front-surface side used for detecting infrared light and illuminance are divided by a light-shielding plate 431 into pixels for detecting infrared light and pixels for detecting illuminance.

In this case, a color filter for capturing an image, such as a color filter having a Bayer arrangement, is provided on the back-surface side. The IR cut filter 422, a shutter 423-1, and a light collecting lens 424-1 are provided in the portion for detecting illuminance on the front-surface side. An infrared transmitting filter 432, a shutter 423-2, and a light collecting lens 424-2 are provided in the portion for detecting infrared light. An example of the filters used in this case is illustrated in FIG. 23. In a case where light which enters a photodiode may be determined only by the IR cut filter 422 or the infrared transmitting filter 432 in the module, the color filter may be omitted. On the other hand, in a case where light which enters a photodiode may be determined only by the color filter, the IR cut filter 422 or the infrared transmitting filter 432 in the module may be omitted. Such omission enables reduction in cost.

The application is not limited to the above-described examples. For example, one of the above-described two regions may be used as a region for capturing a right-eye image of a stereoscopic image (3D image), and the other region may be used as a region for capturing a left-eye image of the stereoscopic image, so that the imaging device 100 is capable of capturing a 3D image.

As described above, the imaging module 400 includes the imaging device 100, and thus the performance of the function of capturing images of subjects in a plurality of directions may be further enhanced.

3. Third Embodiment

Appearance of Electronic Apparatus

The present technology is also applicable to an electronic apparatus having a function of capturing images of subjects on both of a front-surface side and a back-surface side. FIGS. 24A, 24B, and 24C are diagrams illustrating appearances of such an electronic apparatus. As in the example illustrated in FIGS. 2A, 2B, and 2C, the electronic apparatus 500 in FIG. 24A includes a front lens 511 on a front surface 501. The front lens 511 is used for capturing an image of a subject on the front-surface side.

As illustrated in FIG. 24B, the electronic apparatus 500 includes a back lens 512 on a back surface 502. The back lens 512 is used for capturing an image of a subject on the back-surface side.

As illustrated in FIG. 24C, the electronic apparatus 500 includes the above-described imaging module 400. The imaging module 400 is capable of capturing an image of a subject on the front-surface side by using the front lens 511. Also, the imaging module 400 is capable of capturing an image of a subject on the back-surface side by using the back lens 512.

With this configuration, the electronic apparatus 500 is smaller and thinner than the electronic apparatus 30 illustrated in FIGS. 2A, 2B, and 2C. Also, the manufacturing cost may be reduced.

Internal Configuration of Electronic Apparatus

FIG. 25 is a block diagram illustrating an example of an internal configuration of the electronic apparatus 500. As illustrated in FIG. 25, the electronic apparatus 500 includes the imaging module 400, an A/D converter 521, an image processing unit 522, a display unit 523, a codec processing unit 524, a recording unit 525, a control unit 530, and an operation unit 531.

The imaging module 400 includes the imaging device 100, as described above, and is capable of performing photoelectric conversion on both of light incident on the front-surface side and light incident on the back-surface side. The imaging module 400 performs photoelectric conversion on these beams of incident light to generate signals for individual pixels (pixel signals), and supplies the pixel signals to the A/D converter 521.

The A/D converter 521 converts the pixel signals supplied from the imaging module 400 at certain timings into pieces of digital data (image data), and sequentially supplies the pieces of data to the image processing unit 522 at certain timings.

The operation unit 531 includes, for example, a jog dial, keys, buttons, a touch panel, or the like, accepts input of an operation performed by a user, and supplies a signal corresponding to the input to the control unit 530.

The control unit 530 controls drive of the individual units in response to a signal corresponding to input of an operation performed by the user using the operation unit 531, so as to cause the individual units to perform a process regarding image capturing.

The image processing unit 522 performs various types of image processing, such as color mixture correction, black level correction, adjustment of white balance, a demosaicing process, a matrix process, gamma correction, and YC conversion, on the image data supplied from the A/D converter 521. The image processing unit 522 supplies the processed image data to the display unit 523 and the codec processing unit 524.

The display unit 523 is constituted as a liquid crystal display or the like, and displays an image of a subject on the basis of the image data supplied from the image processing unit 522.

The codec processing unit 524 performs an encoding process of a certain scheme on the image data supplied from the image processing unit 522, and supplies encoded data obtained thereby to the recording unit 525.

The recording unit 525 records the encoded data supplied from the codec processing unit 524. The encoded data recorded by the recording unit 525 is read out by the image processing unit 522 and is decoded when it is necessary. The image data obtained through the decoding process is supplied to the display unit 523, and the image corresponding to the image data is displayed thereon.

As described above, the electronic apparatus 500 includes the imaging module 400 (imaging device 100) to which the present technology is applied, and is thus capable of realizing a wider range of applications, higher performance, and lower cost of the function of capturing images of subjects in a plurality of directions, and a smaller size of the apparatus.

Flow of Image Capturing Process

An example of a flow of an image capturing process performed by the electronic apparatus 500 will be described with reference to the flowchart in FIG. 26.

In step S301, the control unit 530 determines, in accordance with a user instruction supplied from the operation unit 531, whether or not an image of a subject on the back-surface side is to be captured. If the control unit 530 determines that an image of a subject on the back-surface side is to be captured, the control unit 530 proceeds to step S302 and controls the imaging module 400.

In step S302, the imaging module 400 blocks light on the front-surface side by closing the shutter 423, opens the shutter 413, and drives the imaging device 100, so as to capture an image of a subject on the back-surface side.

After image capturing ends, the control unit 530 proceeds to step S304.

If the control unit 530 determines in step S301 that an image of a subject on the front-surface side is to be captured (or infrared light and illuminance are to be detected), the control unit 530 proceeds to step S303 and controls the imaging module 400.

In step S303, the imaging module 400 blocks light on the back-surface side by closing the shutter 413, opens the shutter 423, and drives the imaging device 100, so as to capture an image of a subject on the front-surface side.

After image capturing ends, the control unit 530 proceeds to step S304.

In step S304, the A/D converter 521 A/D-converts pixel signals output from the imaging module 400 to generate captured image data, which is digital data, in accordance with control performed by the control unit 530.

In step S305, the image processing unit 522 performs certain image processing on the captured image data obtained through A/D conversion, in accordance with control performed by the control unit 530.

In step S306, the display unit 523 displays, on a monitor, a captured image corresponding to the processed captured image data, in accordance with control performed by the control unit 530.

In step S307, the codec processing unit 524 encodes the processed captured image data in accordance with control performed by the control unit 530.

In step S308, the recording unit 525 records the encoded captured image data in accordance with control performed by the control unit 530.

After step S308 ends, the control unit 530 ends the image capturing process.

With this process, the electronic apparatus 500 is capable of easily capturing images of subjects in a plurality of directions. Also, the electronic apparatus 500 may be easily used for a wider range of applications, such as detection of infrared light and illuminance.

Generation of Composite Image

Figure 27:
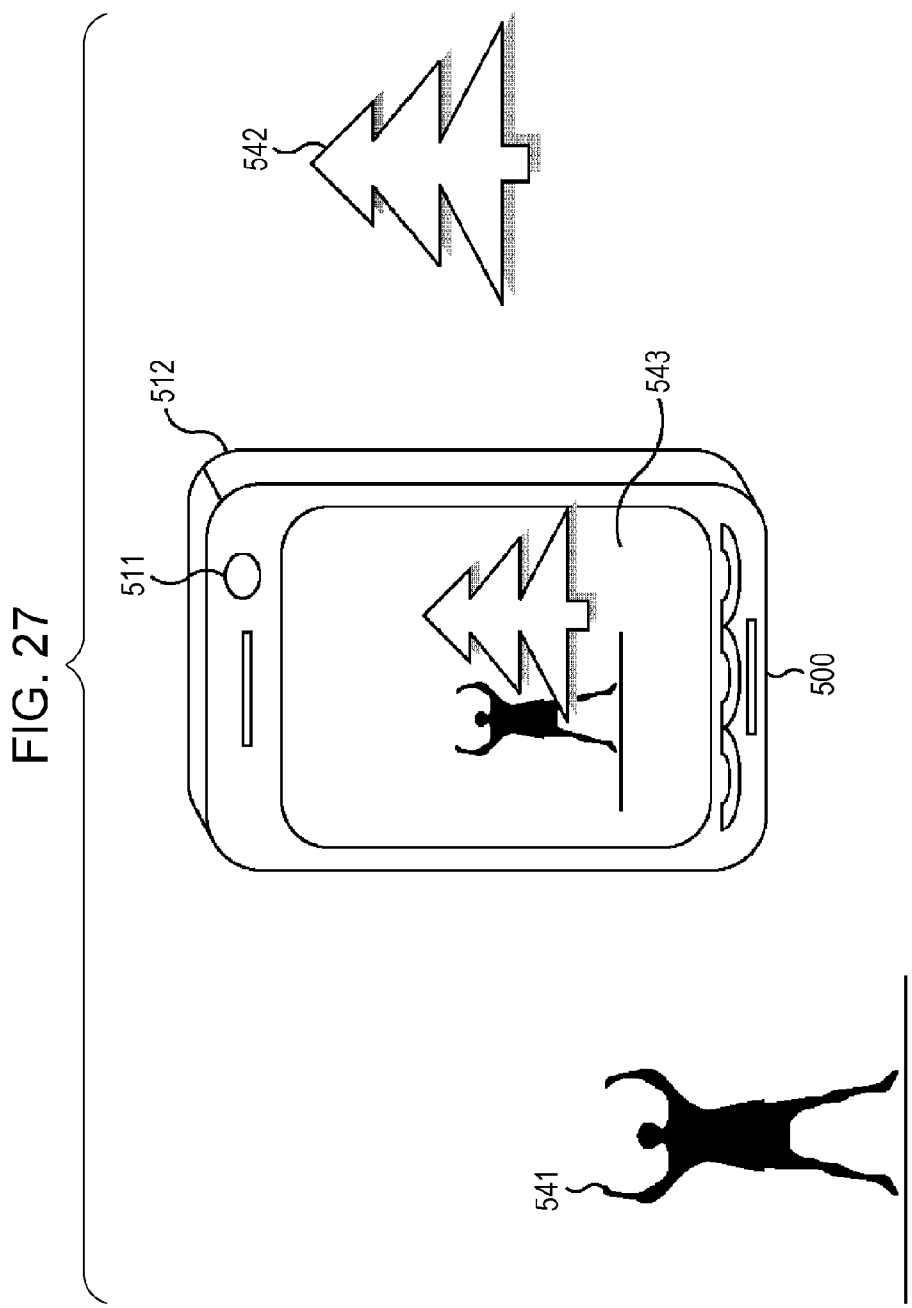
FIG. 27 is a diagram illustrating an example of image capturing.

The electronic apparatus 500 is capable of capturing images of subjects on the front-surface side and the back-surface side by opening the shutters on both sides. In this case, light on the front-surface side and light on the back-surface side are collected to the photodiode 121. That is, as illustrated in FIG. 27, an image of a front subject 541 in front of the electronic apparatus 500 and an image of a back subject 542 behind the electronic apparatus 500 are combined by the photodiode 121. Accordingly, a composite image 543, which is a combination of the image of the front subject 541 and the image of the back subject 542, is output from the imaging module 400. In other words, a composite image, which is a combination of a captured image on the front-surface side and a captured image on the back-surface side, is output from the imaging module 400.

Furthermore, the electronic apparatus 500 (imaging module 400) is capable of individually adjusting the openness of the shutters (density of liquid crystal shutters) on the front-surface side and the back-surface side to adjust the intensity of images on the front-surface side and the back surface side to be combined. Of course, the electronic apparatus 500 (imaging module 400) may capture images on the front-surface side and the back-surface side at different timings.

Furthermore, for example, a charge storage period for capturing an image of a subject on the front-surface side and a charge storage period for capturing an image of a subject on the back-surface side may be set independently from each other. For example, the electronic apparatus 500 (imaging module 400) is capable of setting different charge storage periods for the front-surface side and the back-surface side.

Flow of Image Capturing Process

Figure 28:
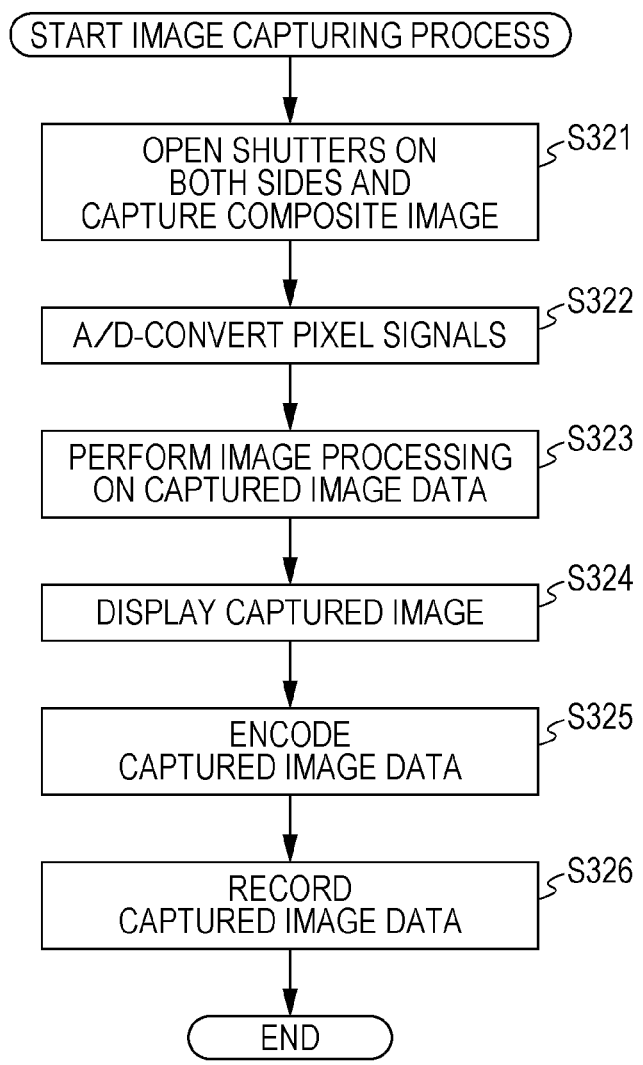
FIG. 28 is a flowchart illustrating another example of a flow of an image capturing process.

An example of a flow of an image capturing process in this case will be described with reference to the flowchart in FIG. 28.

In step S321, the control unit 530 controls the imaging module 400 in response to a user instruction supplied from the operation unit 531. The imaging module 400 opens the shutters on both of the front-surface side and the back-surface side, and drives the imaging device 100 to capture a composite image of subjects on both sides.

Figure 26:
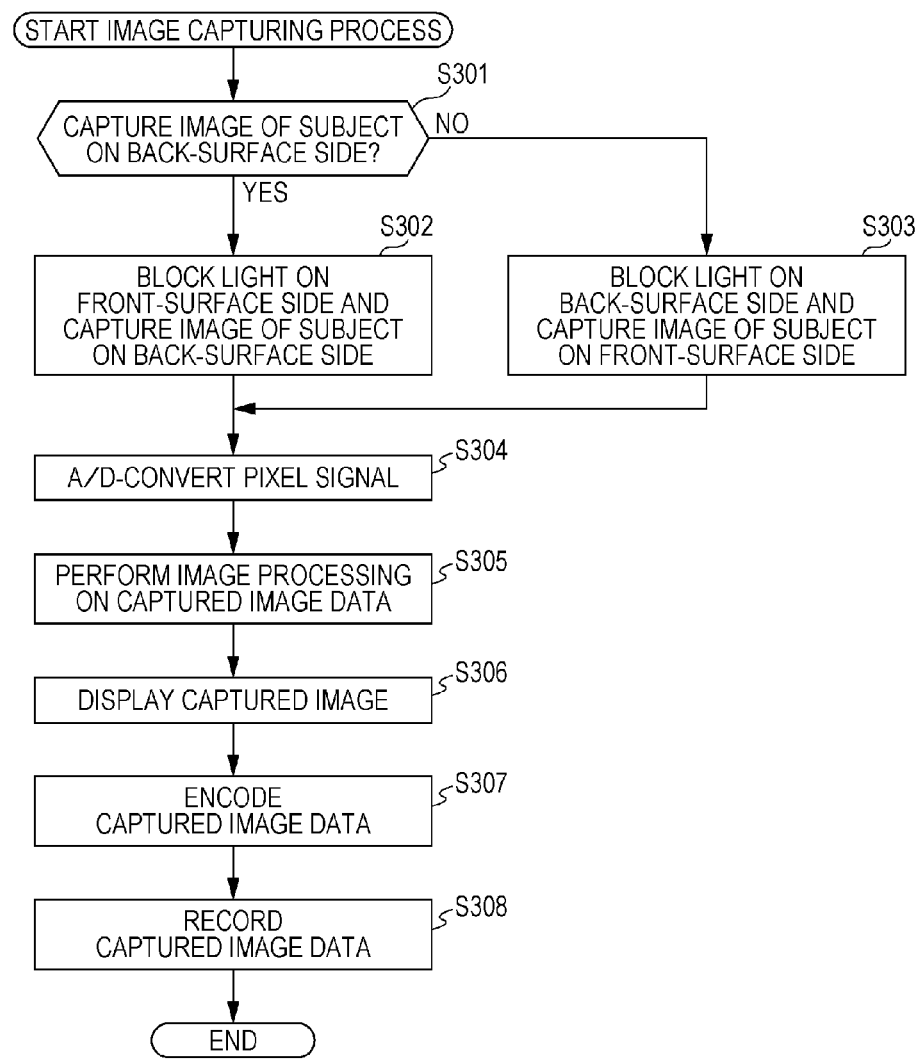
FIG. 26 is a flowchart illustrating an example of a flow of an image capturing process.

Steps S322 to S326 are performed similarly to steps S304 to S308 in FIG. 26.

With this process, the electronic apparatus 500 is capable of easily capturing a composite image of subjects in a plurality of directions.

4. Fourth Embodiment

Information Providing System

An information providing service may be realized by using the electronic apparatus 500 which captures a composite image. For example, a composite image may be used to specify position information.

For example, it is assumed that an information providing service is used in a commercial facility. A user who wants information captures a composite image of the front-surface side and the back-surface side of the electronic apparatus 500 in a commercial facility, and provides the composite image to a server on-line. The server verifies the composite image by using a database, specifies the position where the user exists, and transmits sales promotion information about the commercial facility to a mobile information terminal of the user (for example, the electronic apparatus 500).

The electronic apparatus 500 generates a composite image by using the photodiode 121, as described above. Thus, a process of combining images is not necessary, and the composite image may be obtained in a short time. Also, it is not necessary to process a plurality of images to be combined, and thus the memory capacity for obtaining such a composite image in the electronic apparatus 500 may be reduced. Furthermore, since the electronic apparatus 500 transmits a composite image to a server, information about a plurality of images may be reduced to a data amount corresponding to a single image. Accordingly, the amount of data to be transmitted may be reduced.

Furthermore, the capacity of the database may be reduced because the database stores a composite image of images on the front-surface side and the back-surface side. Furthermore, the load of a verification process performed by the server may be reduced. A similar information providing service may be realized by using only an image captured on the front-surface side or an image captured on the back-surface side. In this case, however, information about only one image is obtained, and thus the amount of information used for verification is smaller than that of a composite image. This may increase the possibility of determination error compared to the case of using a composite image.

The accuracy of specifying the position of a user may be increased by also using position information generated by, for example, a global positioning system (GPS) according to the related art. In the case of using position information generated by a GPS according to the related art, it is difficult to specify a position in a building, and it is difficult to determine the floor where a user exists. With the use of the present technology, the position of a user may be easily and accurately specified by using an image. That is, more accurate information may be provided.

Figure 29:
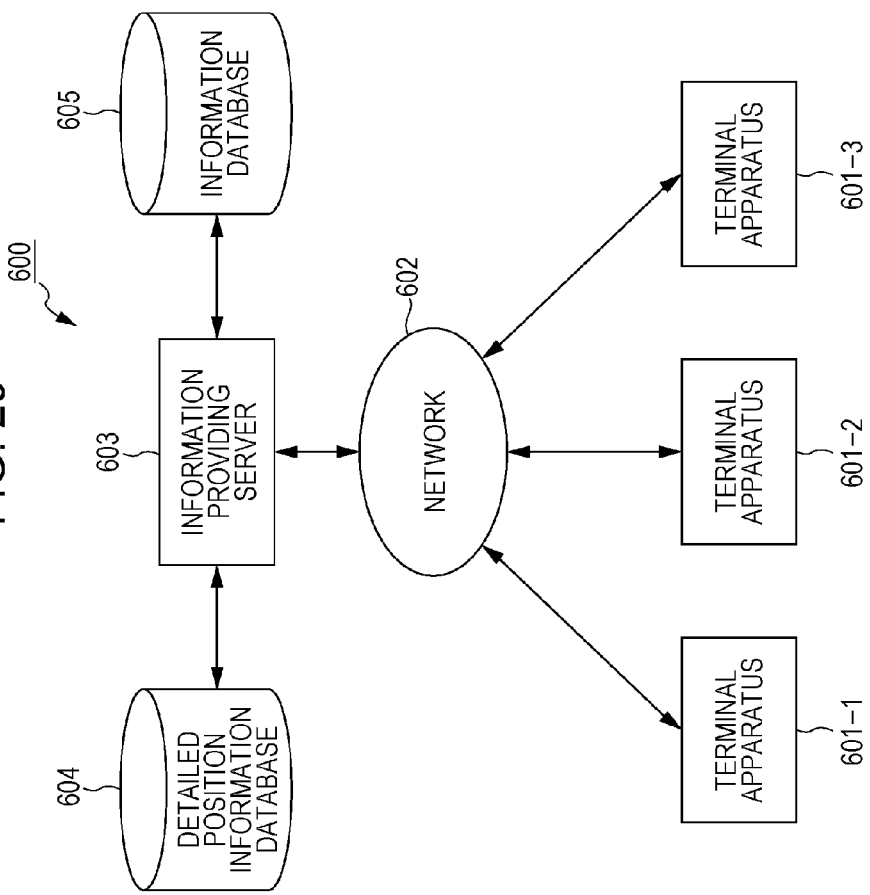
FIG. 29 is a diagram illustrating an example of an information providing system.

FIG. 29 is a diagram illustrating an example configuration of an information providing system 600 that provides the above-described information providing service. The information providing system 600 illustrated in FIG. 29 is a system which provides information from an information providing server 603 to the users of terminal apparatuses 601-1 to 601-3.

Each of the terminal apparatuses 601-1 to 601-3 is referred to as a terminal apparatus 601 when it is not necessary to distinguish them from one another. Three terminal apparatuses 601 are illustrated in FIG. 29, but the number of terminal apparatuses 601 included in the information providing system 600 is not limited.

The terminal apparatuses 601 are connected to the information providing server 603 via a network 602, such as the Internet. The configuration of the network 602 is not limited. For example, the network 602 may be constituted by a plurality of networks. The network 602 may be a wired network, a wireless network, or a combination of wired and wireless networks.

The information providing server 603, which provides information, is connected to a detailed position information database 604 and an information database 605. FIG. 29 illustrates one information providing server 603, one detailed position information database 604, and one information database 605, but the numbers thereof are not limited.

Each of the terminal apparatuses 601 has at least a function similar to that of the electronic apparatus 500. The terminal apparatus 601 also has a function of obtaining position information generated by a GPS or the like.

Figure 30:
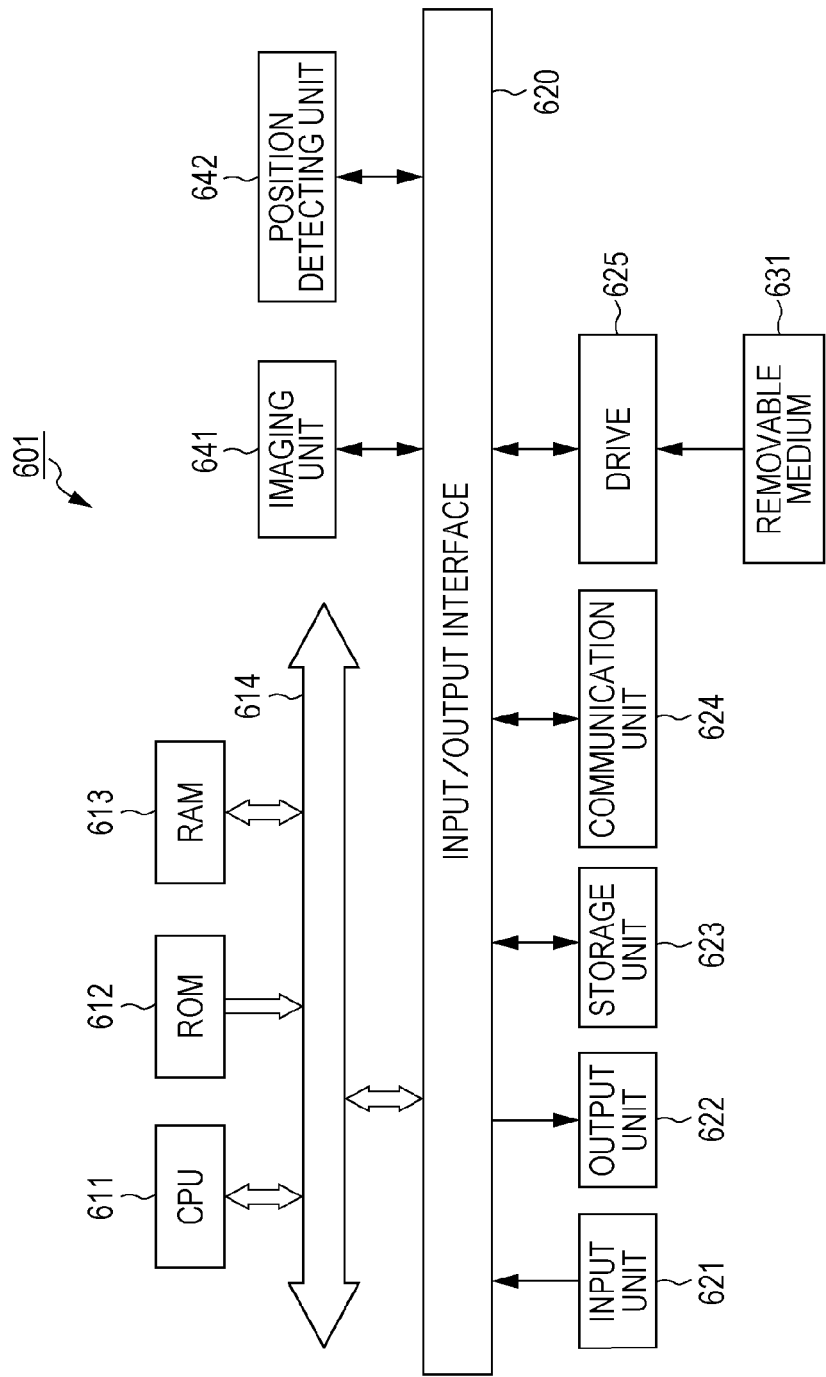
FIG. 30 is a block diagram illustrating an example configuration of a terminal apparatus.

FIG. 30 is a block diagram illustrating an example configuration of the terminal apparatus 601. As illustrated in FIG. 30, in the terminal apparatus 601, a CPU 611, a ROM 612, and a RAM 613 are connected to one another via a bus 614. An input/output interface 620 is connected to the bus 614.

An input unit 621 including a keyboard, a mouse, and the like; an output unit 622 including a display such as a CRT display or LCD, and a speaker; a storage unit 623 including a hard disk or the like; and a communication unit 624 including a modem or the like are connected to the input/output interface 620.

Also, a drive 625 is connected to the input/output interface 620 when it is necessary. A removable medium 631, such as a magnetic disk, an optical disc, a magneto-optical disc, or a semiconductor memory, is loaded into the drive 625 as appropriate, and a computer program read from the removable medium 631 is installed into the storage unit 623 when it is necessary.

Furthermore, an imaging unit 641 and a position detecting unit 642 are connected to the input/output interface 620. The imaging unit 641 has a configuration and function similar to those of the electronic apparatus 500 illustrated in FIG. 25, captures images of subjects on the front-surface side and the back-surface side, and obtains a composite image of the captured images. The position detecting unit 642 obtains a current position (rough position information) of the terminal apparatus 601 from a GPS or the like. The communication unit 624 transmits the composite image obtained from the imaging unit 641 and the position information obtained from the position detecting unit 642 to the information providing server 603.

Figure 31:
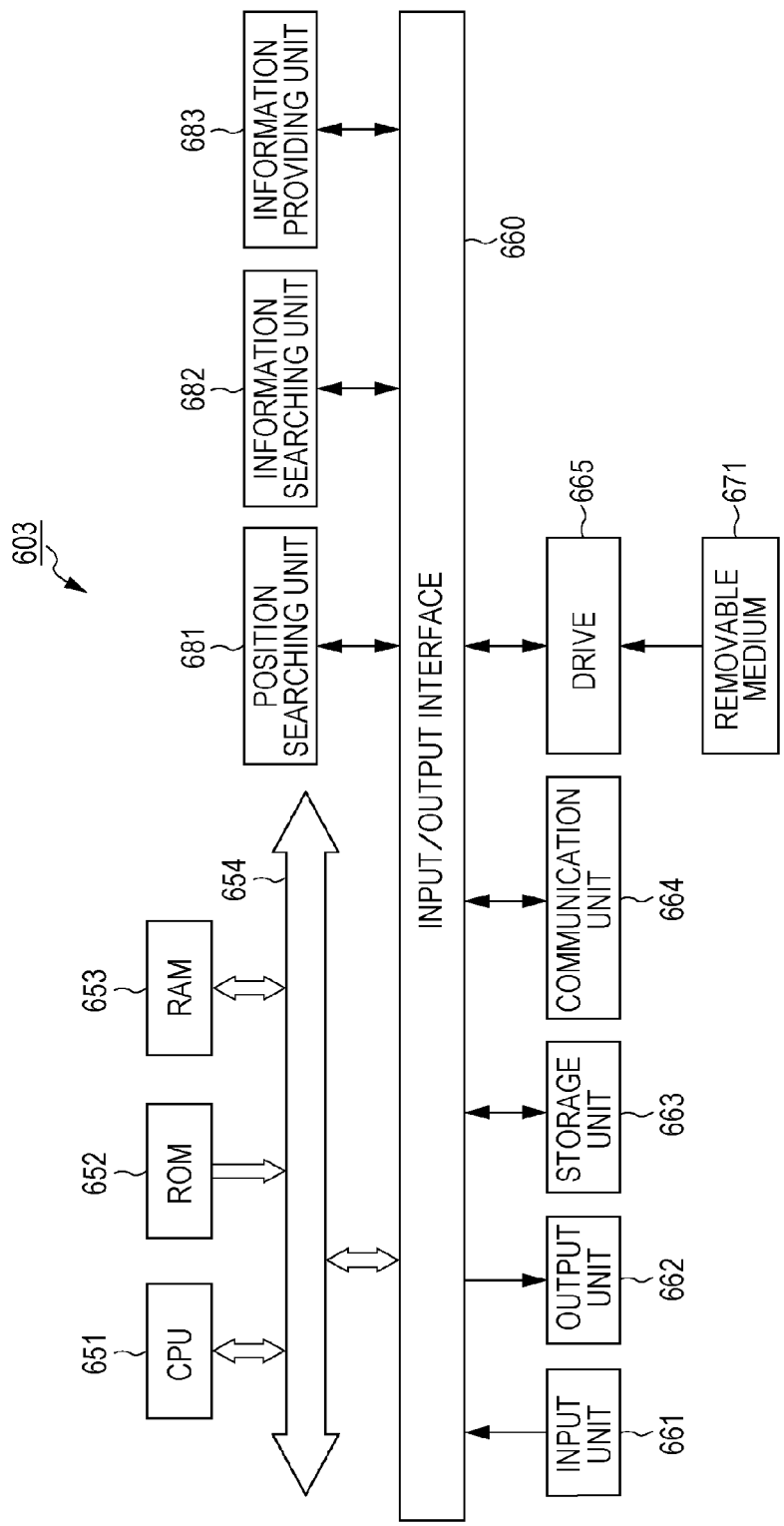
FIG. 31 is a block diagram illustrating an example configuration of an information providing server.

FIG. 31 is a block diagram illustrating an example configuration of the information providing server 603. As illustrated in FIG. 31, the information providing server 603 includes a CPU 651, a ROM 652, a RAM 653, a bus 654, an input/output interface 660, an input unit 661, an output unit 662, a storage unit 663, a communication unit 664, and a drive 665. The CPU 651 to drive 665 are processing units similar to the CPU 611 to drive 625 of the terminal apparatus 601, respectively. A removable medium 671 is a recording medium similar to the removable medium 631.

The information providing server 603 further includes a position searching unit 681, an information searching unit 682, and an information providing unit 683.

The position searching unit 681 supplies position information and a composite image supplied from the terminal apparatus 601 to the detailed position information database 604 to request detailed position information about the terminal apparatus 601. The information searching unit 682 supplies detailed position information about the terminal apparatus 601 specified by the detailed position information database 604 to the information database 605, to request information to be provided to the user of the terminal apparatus 601 corresponding to the detailed position information. The information providing unit 683 performs a process of obtaining position information and a composite image supplied from the terminal apparatus 601, and supplying information specified by the information database 605 to the terminal apparatus 601.

Hereinafter, an example of a flow of an information providing process performed by the terminal apparatus 601 and the information providing server 603 will be described with reference to the flowchart in FIG. 32.

In step S401, the imaging unit 641 of the terminal apparatus 601 captures a composite image of images on the front-surface side and the back-surface side (both-side composite image) in accordance with an operation performed by a user. In step S402, the position detecting unit 642 of the terminal apparatus 601 detects a rough position of the terminal apparatus 601 by using a GPS or the like, and thereby obtains position information. In step S403, the communication unit 624 transmits the both-side composite image and the position information to the information providing server 603.

In step S421, the information providing unit 683 of the information providing server 603 obtains the position information and the both-side composite image via the network 602. In step S422, the position searching unit 681 of the information providing server 603 searches for detailed position information about the terminal apparatus 601 on the basis of the obtained position information and the both-side composite image. That is, the position searching unit 681 provides the obtained position information and both-side composite image to the detailed position information database 604, to request detailed position information about the terminal apparatus 601 that has transmitted the image.

The detailed position information database 604 specifies a rough position of the terminal apparatus 601 on the basis of the position information, and then searches for a both-side composite image corresponding to the position and the provided both-side composite image among data stored in advance. When a target both-side composite image is found, the detailed position information database 604 provides the detailed position information associated with the both-side composite image to the information providing server 603.

After the position searching unit 681 has obtained the detailed position information, in step S423, the information searching unit 682 of the information providing server 603 searches for the information to be provided on the basis of the detailed position information. That is, the information searching unit 682 supplies the detailed position information to the information database 605, to request the information corresponding to the detailed position information. The information database 605 searches for the information to be provided to the terminal apparatus 601, corresponding to the supplied detailed position information, and supplies the information obtained through the search to the information providing server 603.

After the information searching unit 682 has obtained the information to be provided, in step S424, the information providing unit 683 of the information providing server 603 supplies, via the network 602, the information to the terminal apparatus 601 which has supplied the composite image.

In step S404, the communication unit 624 of the terminal apparatus 601 receives the information. The output unit 622 of the terminal apparatus 601 outputs the information in the form of an image, sound, or the like, so as to present it to the user.

As described above, the present technology is applicable to an arbitrary service, such as an information providing service, in which a composite image obtained by using the imaging device 100 is used.

The configurations of the imaging device, various apparatuses, and system to which the present technology is applied are not limited to those described above, and other configurations may be used.

Each of the above-described apparatuses may of course have a configuration other than that described above. Also, the apparatus may be configured as a system formed of a plurality of apparatuses, not as a single apparatus.

In the case of causing software to execute the above-described series of processes, a program constituting the software is installed via a network or a recording medium.

Examples of the recording medium include the removable medium 231 (FIG. 5), the removable medium 331 (FIG. 10), a removable medium (not illustrated) loaded into the drive included in the control unit 530 (FIG. 25), the removable medium 631 (FIG. 30), and the removable medium 671 (FIG. 31), which are separated from the body of an apparatus and which are distributed to supply the program to a user.

Examples of these removable media include a magnetic disk (including a flexible disk), an optical disc (including a compact disc-read only memory (CD-ROM) and a digital versatile disc (DVD)), a magneto-optical disc (including a Mini Disc (MD)), and a semiconductor memory. Also, examples of the above-described recoding medium include the ROM in the control unit 201 (FIG. 5), the control unit 30 (FIG. 10), and the control unit 530 (FIG. 25), the ROM 612 (FIG. 30), the ROM 652 (FIG. 31), the storage unit 223 (FIG. 5), the storage unit 323 (FIG. 10), a storage unit (not illustrated) in the control unit 530 (FIG. 25), the storage unit 623 (FIG. 30), and the hard disk in the storage unit 633 (FIG. 31), which have a program recorded thereon and which are distributed to users in the state of being incorporated in the body of an apparatus.

A program executed by a computer may be a program in which processes are performed in time series in accordance with the order described in this specification, or may be a program in which processes are performed in parallel or at certain timings, for example, when the processes are called.

In this specification, steps describing a program recorded on a recording medium may be performed in time series in accordance with the order described above, or may be performed in parallel or individually.

In this specification, a "system" means an entire apparatus constituted by a plurality of devices (apparatuses).

A configuration described above as a single apparatus (or a single processing unit) may be constituted by a plurality of apparatuses (or processing units). Also, a configuration described above as a plurality of apparatuses (or processing units) may be constituted by a single apparatus (or a single processing unit). Also, a configuration other than the above-described configurations may be added to the configuration of each apparatus (or processing unit). Furthermore, part of the configuration of a certain apparatus (or processing unit) may be included in another apparatus (or another processing unit) as long as the configuration and operation of an entire system are substantially the same. That is, the embodiments of the present disclosure are not limited to the above-described embodiments, and various modifications may be made without deviating from the gist of the present disclosure.

The present technology may also provide the following configurations.

(1) An imaging device including:
a silicon substrate having a photoelectric conversion element therein; and
a wiring layer on a front-surface side of the silicon substrate,
wherein the photoelectric conversion element performs photoelectric conversion on light which enters the photoelectric conversion element from the front-surface side through the wiring layer, and performs photoelectric conversion on light which enters the photoelectric conversion element from a back-surface side of the silicon substrate without going through the wiring layer.

(2) The imaging device according to item (1),
wherein the wiring layer includes a wiring element, which is disposed in a region in the wiring layer other than a region serving as a light path for light which enters the photoelectric conversion element.

(3) The imaging device according to item (2),
wherein the light path is provided with a waveguide.

(4) The imaging device according to any of items (1) to (3), further including:
a color filter on the back-surface side of the photoelectric conversion element; and
a filter on the front-surface side of the photoelectric conversion element, the filter not being a color filter.

(5) The imaging device according to item (4),
wherein the filter includes at least any one of an infrared transmitting filter and a white-pixel filter.

(6) The imaging device according to item (4) or (5),
wherein the color filter is provided for each of pixels, and the color filters for the pixels are separated from one another by a certain inorganic film.

(7) The imaging device according to any of items (1) to (6), further including:
a first on-chip lens on the back-surface side of the photoelectric conversion element; and
a second on-chip lens on the front-surface side of the photoelectric conversion element.

(8) The imaging device according to item (7),
wherein the first on-chip lens and the second on-chip lens are made of an inorganic material.

(9) The imaging device according to any of items (1) to (6), further including:
an on-chip lens on the back-surface side of the photoelectric conversion element.

(10) The imaging device according to any of items (1) to (9),
wherein the silicon substrate has a vertical spectroscopic structure including a plurality of photoelectric conversion elements, each of which is the photoelectric conversion element, as a configuration of each pixel.

(11) The imaging device according to any of items (1) to (10), further including:
an electrode portion which serves as an external terminal for a wiring element in the wiring layer,
wherein the silicon substrate and the wiring layer have an opening which allows the electrode portion to be exposed on the back-surface side.

(12) The imaging device according to item (11),
wherein the electrode portion has a certain thickness so that a component stacked on the electrode portion is higher than a component formed in a pixel region in which the photoelectric conversion element is formed.

(13) The imaging device according to any of items (1) to (12), further including:
a support substrate through which light passes and which is bonded to the front-surface side of the wiring layer by using a certain adhesive material.

(14) The imaging device according to any of items (1) to (12), further including:
a support substrate through which light passes and which is bonded to the front-surface side of the wiring layer by using plasma bonding.

(15) The imaging device according to any of items (1) to (14), further including:
a support substrate through which light passes and which is on the front-surface side of the wiring layer; and
a circuit in the support substrate, the circuit being disposed in a region other than a pixel region in which the photoelectric conversion element is formed.

(16) The imaging device according to any of items (1) to (15), further including:
a pixel in which light incident on one of the back-surface side and the front-surface side of the photoelectric conversion element is blocked by either or both of a wiring element and a light-shielding film, and in which the photoelectric conversion element performs photoelectric conversion on light incident on the other of the back-surface side and the front-surface side.

(17) The imaging device according to any of items (1) to (16), further including:
a first shutter which is on the back-surface side of the photoelectric conversion element and which controls entering of light from the back-surface side; and
a second shutter which is on the front-surface side of the photoelectric conversion element and which controls entering of light from the front-surface side,
wherein the first shutter and the second shutter are driven independently from each other.

(18) The imaging device according to any of items (1) to (17),
wherein a pixel region on one side of the photoelectric conversion element is divided into regions by a light-shielding plate, and pixels in the regions are used for detecting different wavelength ranges.

(19) An electronic apparatus including:
an imaging device including a silicon substrate having a photoelectric conversion element therein, and a wiring layer on a front-surface side of the silicon substrate, wherein the photoelectric conversion element performs photoelectric conversion on light which enters the photoelectric conversion element from the front-surface side through the wiring layer, and performs photoelectric conversion on light which enters the photoelectric conversion element from a back-surface side of the silicon substrate without going through the wiring layer; and
an image processing unit configured to perform image processing on an image obtained by the imaging device.

(20) A manufacturing method for a manufacturing apparatus, including:

manufacturing, with a manufacturing unit, a front-illuminated image sensor;

bonding, with a bonding unit, a support substrate through which light passes to a front-surface side of the front-illuminated image sensor by using an adhesive material;

polishing, with a polishing unit, a back-surface side of the front-illuminated image sensor; and forming, with a forming unit, an on-chip lens on the polished back-surface side of the front-illuminated image sensor.

The present disclosure contains subject matter related to that disclosed in Japanese Priority Patent Application JP 2011-216200 filed in the Japan Patent Office on Sep. 30, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
   a silicon substrate having a photoelectric conversion element therein;
   a wiring layer on a front-surface side of the silicon substrate, wherein the photoelectric conversion element performs:
      photoelectric conversion on light which enters the photoelectric conversion element from the front-surface side of the silicon substrate; and
      photoelectric conversion on light which enters the photoelectric conversion element from a back-surface side of the silicon substrate; and
   an electrode portion which serves as an external terminal for a wiring element in the wiring layer, wherein the electrode portion is formed on a front-surface side of the wiring layer, and exposed on a back-surface side of the electrode portion.

2. The imaging device according to claim 1, wherein the wiring element is disposed in a region in the wiring layer other than a region serving as a light path for light which enters the photoelectric conversion element.

3. The imaging device according to claim 2, wherein the light path is provided with a waveguide.

4. The imaging device according to claim 1, further comprising:
   a color filter on the back-surface side of the photoelectric conversion element; and
   a filter on the front-surface side of the photoelectric conversion element, the filter not being a color filter.

5. The imaging device according to claim 4, wherein the filter includes at least one of an infrared transmitting filter or a white-pixel filter.

6. The imaging device according to claim 4, wherein the color filter is provided for each of pixels, and the color filter for each of the pixels is separated from another color filter by an inorganic film.

7. The imaging device according to claim 1, further comprising:
   a first on-chip lens on the back-surface side of the photoelectric conversion element; and
   a second on-chip lens on the front-surface side of the photoelectric conversion element.

8. The imaging device according to claim 7, wherein the first on-chip lens and the second on-chip lens are made of an inorganic material.

9. The imaging device according to claim 1, further comprising:
   an on-chip lens on the back-surface side of the photoelectric conversion element.

10. The imaging device according to claim 1, wherein the silicon substrate has a vertical spectroscopic structure including a plurality of photoelectric conversion elements, wherein each of the plurality of photoelectric conversion elements is the photoelectric conversion element, as a configuration of each pixel.

11. The imaging device according to claim 1,
    wherein the silicon substrate and the wiring layer have an opening which allows the electrode portion to be exposed on the back-surface side.

12. The imaging device according to claim 1, wherein the electrode portion has a predefined thickness such that a component stacked on the electrode portion is closer to the front-surface side than a component formed in a pixel region in which the photoelectric conversion element is formed.

13. The imaging device according to claim 1, further comprising:
    a support substrate through which light passes and which is bonded to the front-surface side of the silicon substrate by using an adhesive material.

14. The imaging device according to claim 1, further comprising:
    a support substrate through which light passes and which is bonded to the front-surface side of the silicon substrate using plasma bonding.

15. The imaging device according to claim 1, further comprising:
    a support substrate through which light passes and which is disposed on the front-surface side of the silicon substrate; and
    a circuit in the support substrate, the circuit being disposed in a region other than a pixel region in which the photoelectric conversion element is formed.

16. The imaging device according to claim 1, further comprising:
    a pixel in which light incident on one of the back-surface side and the front-surface side of the photoelectric conversion element is blocked by either or both of the wiring element and a light-shielding film, and in which the photoelectric conversion element performs photoelectric conversion on light incident on other of the back-surface side and the front-surface side.

17. The imaging device according to claim 1, further comprising:
    a first shutter which is on the back-surface side of the photoelectric conversion element and which controls entering of light from the back-surface side; and a second shutter which is on the front-surface side of the photoelectric conversion element and which controls entering of light from the front-surface side,
    wherein the first shutter and the second shutter are driven independently from each other.

18. The imaging device according to claim 1, wherein a pixel region on one side of the photoelectric conversion element is divided into regions by a light-shielding plate, and pixels in the regions are used for detecting different wavelength ranges.

* * * * *